US011972725B2

(12) United States Patent
Zhou et al.

(10) Patent No.: US 11,972,725 B2
(45) Date of Patent: Apr. 30, 2024

(54) DISPLAY APPARATUS WITH CIRCUIT TO OBTAIN RESIDUAL VOLTAGE OF LIGHT EMITTING ELEMENT

(71) Applicants: Chengdu BOE Optoelectronics Technology Co., Ltd., Sichuan (CN); BOE Technology Group Co., Ltd., Beijing (CN)

(72) Inventors: Hongjun Zhou, Beijing (CN); Feng Wei, Beijing (CN); Cong Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 274 days.

(21) Appl. No.: 17/434,402

(22) PCT Filed: Nov. 25, 2020

(86) PCT No.: PCT/CN2020/131385
§ 371 (c)(1),
(2) Date: Aug. 26, 2021

(87) PCT Pub. No.: WO2022/109845
PCT Pub. Date: Jun. 2, 2022

(65) Prior Publication Data
US 2023/0316999 A1 Oct. 5, 2023

(51) Int. Cl.
G09G 3/32 (2016.01)
G09G 3/3233 (2016.01)
H10K 59/131 (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ............. H10K 59/131; G09G 2310/08; G09G 2310/0297; G09G 2310/0819;
(Continued)

(56) References Cited

U.S. PATENT DOCUMENTS

2013/0050292 A1  2/2013  Mizukoshi
2013/0162617 A1  6/2013  Yoon et al.
(Continued)

FOREIGN PATENT DOCUMENTS

CN   102968954 A   3/2013
CN   103177685 A   6/2013
(Continued)

OTHER PUBLICATIONS

First Office Action in the Chinese Patent Application No. 202080003097.5, dated Feb. 25, 2023; English translation attached.
(Continued)

*Primary Examiner* — Liliana Cerullo
(74) *Attorney, Agent, or Firm* — Intellectual Valley Law, P.C.

(57) ABSTRACT

A method for image display in a display apparatus is provided. The method includes displaying an image in a respective subpixel in an image display phase. In a sensing phase subsequent to the image display phase, the method further includes providing an initial voltage signal to an anode of a respective light emitting element in the respective subpixel for a first period of time; allowing the anode of a respective light emitting element to discharge for a second period of time, upon discontinuation of the initial voltage signal; obtaining a residual voltage signal at the anode of the respective light emitting element at an end of the second period of time by a sensing sub-circuit of a respective pixel driving circuit; and transmitting the residual voltage signal to an integrated circuit.

14 Claims, 25 Drawing Sheets

(52) U.S. Cl.
CPC ............... *G09G 2300/0452* (2013.01); *G09G 2300/0819* (2013.01); *G09G 2300/0842* (2013.01); *G09G 2310/0297* (2013.01); *G09G 2310/08* (2013.01); *G09G 2330/08* (2013.01); *G09G 2330/12* (2013.01)

(58) Field of Classification Search
CPC ... G09G 2310/0452; G09G 2310/0426; G09G 3/3233

See application file for complete search history.

(56) References Cited

U.S. PATENT DOCUMENTS

| | | | |
|---|---|---|---|
| 2013/0265338 A1* | 10/2013 | Chaji | G09G 3/3208 345/690 |
| 2014/0092076 A1 | 4/2014 | Lee | |
| 2015/0035734 A1 | 2/2015 | Lee et al. | |
| 2015/0161940 A1 | 6/2015 | Woo et al. | |
| 2016/0071445 A1 | 3/2016 | Kim et al. | |
| 2017/0206839 A1* | 7/2017 | Wu | G09G 3/3233 |
| 2017/0287390 A1* | 10/2017 | Lee | G09G 3/3233 |
| 2018/0083072 A1* | 3/2018 | Kwon | H10K 59/35 |
| 2020/0135094 A1 | 4/2020 | Chen et al. | |
| 2021/0225955 A1 | 7/2021 | Yuan et al. | |
| 2022/0123092 A1* | 4/2022 | Park | G02F 1/136263 |
| 2023/0274688 A1* | 8/2023 | Cao | G09G 3/3233 345/55 |

FOREIGN PATENT DOCUMENTS

| | | |
|---|---|---|
| CN | 103714777 A | 4/2014 |
| CN | 104347030 A | 2/2015 |
| CN | 104715718 A | 6/2015 |
| CN | 105427794 A | 3/2016 |
| CN | 107507572 A | 12/2017 |
| CN | 108877685 A | 11/2018 |
| CN | 110189697 A | 8/2019 |
| CN | 110197644 A | 9/2019 |
| CN | 110197645 A | 9/2019 |
| CN | 110322835 A | 10/2019 |
| CN | 110956911 A | 4/2020 |
| KR | 20170003843 A | 1/2017 |
| KR | 20200076196 A | 6/2020 |

OTHER PUBLICATIONS

International Search Report & Written Opinion dated Aug. 23, 2021, regarding PCT/CN2020/131385.

* cited by examiner

FIG. 15

DISPLAY APPARATUS WITH CIRCUIT TO OBTAIN RESIDUAL VOLTAGE OF LIGHT EMITTING ELEMENT

CROSS-REFERENCE TO RELATED APPLICATION

This application is a national stage application under 35 U.S.C. § 371 of International Application No. PCT/CN2020/131385, filed Nov. 25, 2020, the contents of which are incorporated by reference in the entirety.

TECHNICAL FIELD

The present invention relates to the field of display technology, more particularly, to a method for image display in a display apparatus, a display apparatus, a peripheral sensing circuit, and a pixel driving circuit.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a method for image display in a display apparatus, comprising displaying an image in a respective subpixel in an image display phase; in a sensing phase subsequent to the image display phase, the method further comprises providing an initial voltage signal to an anode of a respective light emitting element in the respective subpixel for a first period of time; allowing the anode of a respective light emitting element to discharge for a second period of time, upon discontinuation of the initial voltage signal; obtaining a residual voltage signal at the anode of the respective light emitting element at an end of the second period of time by a sensing sub-circuit of a respective pixel driving circuit; and transmitting the residual voltage signal to an integrated circuit.

Optionally, in a subsequent image display phase, the method further comprises compensating a data signal provided to the respective subpixel in the subsequent image display phase by the integrated circuit based on a residual voltage difference between a value of the residual voltage signal and a reference residual voltage value.

Optionally, obtaining the residual voltage signal comprises providing a sensing control signal to a gate electrode of a sensing transistor in the sensing sub-circuit to turn on the sensing transistor; and allowing the residual voltage signal at the anode of the respective light emitting element to pass through the sensing transistor and transmit to the integrated circuit through a respective sensing signal line.

Optionally, providing the initial voltage signal comprises providing the initial voltage signal to a source electrode of a reset transistor in the respective pixel driving circuit, a drain electrode of the reset transistor being connected to the anode of the respective light emitting element; and providing a reset control signal to a gate electrode of the reset transistor to turn on the reset transistor for the first period of time.

Optionally, providing the initial voltage signal comprises providing the initial voltage signal to a drain electrode of a sensing transistor in the sensing sub-circuit through a respective sensing signal line, a source electrode of the sensing transistor being connected to the anode of the respective light emitting element; and providing a sensing control signal to a gate electrode of the sensing transistor to turn on the sensing transistor for the first period of time.

Optionally, providing the initial voltage signal further comprises providing the initial voltage signal to a source electrode of a first reference transistor through a reference signal line, a drain electrode of the first reference transistor being connected to the source electrode of the sensing transistor through the respective sensing signal line; and providing a first reference control signal to a gate electrode of the first reference transistor to turn on the first reference transistor for a period of time.

Optionally, providing the initial voltage signal further comprises providing the initial voltage signal to a source electrode of a first reference transistor and a source electrode of a second reference transistor through a reference signal line, a drain electrode of the first reference transistor and a drain electrode of the second reference transistor being connected to the source electrode of the sensing transistor through the respective sensing signal line; and providing a reference control signal to a gate electrode of the first reference transistor or a gate electrode of the second reference transistor or both, to turn on the first reference transistor or the second reference transistor or both, for the first period of time.

Optionally, the reference signal line is in a same layer as a plurality of data lines.

Optionally, the method further comprises transmitting residual voltage signals respectively from a plurality of columns of subpixels to the integrated circuit through N number of sensing multiplexers, N≥2, the N number of sensing multiplexers configured to be time-sequentially turned on to allow transmission of the residual voltage signals respectively from the plurality of columns of subpixels to the integrated circuit respectively through a plurality of sensing signal lines.

Optionally, the integrated circuit is a data driving integrated circuit; the method further comprises transmitting data signals from the integrated circuit respectively to the plurality of columns of subpixels through M number of data multiplexers, M≥2, the M number of data multiplexers configured to be time-sequentially turned on to allow transmission of the data signals respectively to the plurality of columns of subpixels respectively through a plurality of data lines.

Optionally, the N number of sensing multiplexers comprise a first sensing multiplexer, a second sensing multiplexer, and a third sensing multiplexer; the first sensing multiplexer is configured to be turned on to allow transmission of first residual voltage signals respectively from first columns of subpixels of a first color to the integrated circuit;

the second sensing multiplexer is configured to be turned on to allow transmission of second residual voltage signals respectively from second columns of subpixels of a second color to the integrated circuit; and the third sensing multiplexer is configured to be turned on to allow transmission of third residual voltage signals respectively from third columns of subpixels of a third color to the integrated circuit.

Optionally, the N number of sensing multiplexers comprise a first sensing multiplexer, a second sensing multiplexer, and a third sensing multiplexer; the first sensing multiplexer is configured to be turned on to allow transmission of first residual voltage signals respectively from first columns of subpixels to the integrated circuit; the second sensing multiplexer is configured to be turned on to allow transmission of second residual voltage signals respectively from second columns of subpixels to the integrated circuit; the third sensing multiplexer is configured to be turned on to allow transmission of third residual voltage signals respectively from third columns of subpixels to the integrated circuit; a respective first column comprises subpixels of a first color and subpixels of a third color alternately arranged along a column direction; a respective second column comprises subpixels of a second color; and a respective third column comprises subpixels of the third color and subpixels of the first color alternately arranged along the column direction.

In another aspect, the present disclosure provides a display apparatus, comprising a plurality of pixel driving circuits; a plurality of sensing signal lines; and an integrated circuit; wherein a respective pixel driving circuit comprises a sensing sub-circuit configured to obtain a residual voltage signal at an anode of a respective light emitting element; a respective sensing signal line is configured to transmit the residual voltage signal to the integrated circuit; and the integrated circuit is configured to compensate a data signal provided to a respective subpixel in a subsequent image display phase based on a residual voltage difference between a value of the residual voltage signal and a reference residual voltage value.

Optionally, the sensing sub-circuit comprises a sensing transistor having a gate electrode connected to a sensing control signal line, a source electrode connected to the anode of the respective light emitting element, and a drain electrode connected to the respective sensing signal line.

Optionally, the display apparatus further comprises a reference signal line; a first reference control signal line, and a plurality of first reference transistors, source electrodes of the plurality of first reference transistors respectively connected to the reference signal line, drain electrodes of the plurality of first reference transistors respectively connected to the plurality of sensing signal lines, and gate electrodes of the plurality of first reference transistors respectively connected to the first reference control signal line.

Optionally, the display apparatus further comprises a reference signal line; a first reference control signal line; a second reference control signal line; a plurality of first reference transistors, source electrodes of the plurality of first reference transistors respectively connected to the reference signal line, drain electrodes of the plurality of first reference transistors respectively connected to the plurality of sensing signal lines, and gate electrodes of the plurality of first reference transistors respectively connected to the first reference control signal line; and a plurality of second reference transistors, source electrodes of the plurality of second reference transistors respectively connected to the reference signal line, drain electrodes of the plurality of second reference transistors respectively connected to the plurality of sensing signal lines, and gate electrodes of the plurality of second reference transistors respectively connected to the second reference control signal line.

Optionally, the reference signal line is in a same layer as a plurality of data lines.

Optionally, the display apparatus further comprises N number of sensing multiplexers, N≥2; wherein the N number of sensing multiplexers are configured to be time-sequentially turned on to allow transmission of residual voltage signals respectively from a plurality of columns of subpixels to the integrated circuit respectively through a plurality of sensing signal lines.

Optionally, the integrated circuit is a data driving integrated circuit; the display apparatus further comprises M number of data multiplexers, M≥2; and a plurality of data lines respectively connected to the plurality of columns of subpixels; wherein the M number of data multiplexers are configured to be time-sequentially turned on to allow transmission of data signals respectively to the plurality of columns of subpixels respectively through the plurality of data lines.

Optionally, the display apparatus further comprises a plurality of lead lines respectively connected to the integrated circuit; wherein a respective lead line of the plurality of lead lines is connected to source electrodes of at least two switching transistors respectively from at least two different sensing multiplexers of the N number of sensing multiplexers and connected to source electrodes of at least two switching transistors respectively from at least two different data multiplexers of the M number of data multiplexers.

Optionally, the N number of sensing multiplexers comprise a first sensing multiplexer, a second sensing multiplexer, and a third sensing multiplexer; the first sensing multiplexer is configured to be turned on to allow transmission of first residual voltage signals respectively from first columns of subpixels of a first color to the integrated circuit; the second sensing multiplexer is configured to be turned on to allow transmission of second residual voltage signals respectively from second columns of subpixels of a second color to the integrated circuit; and the third sensing multiplexer is configured to be turned on to allow transmission of third residual voltage signals respectively from third columns of subpixels of a third color to the integrated circuit.

Optionally, the N number of sensing multiplexers comprise a first sensing multiplexer, a second sensing multiplexer, and a third sensing multiplexer; the first sensing multiplexer is configured to be turned on to allow transmission of first residual voltage signals respectively from first columns of subpixels of a first color to the integrated circuit; the second sensing multiplexer is configured to be turned on to allow transmission of second residual voltage signals respectively from second columns of subpixels of a second color to the integrated circuit; the third sensing multiplexer is configured to be turned on to allow transmission of third residual voltage signals respectively from third columns of subpixels of a third color to the integrated circuit, the M number of data multiplexers comprise a first data multiplexer and a second data multiplexer; the first data multiplexer is configured to be turned on to allow transmission of data signals respectively to odd-numbered columns of subpixels; and the second data multiplexer is configured to be turned on to allow transmission of data signals respectively to even-numbered columns of subpixels.

Optionally, the display apparatus further comprises a plurality of lead lines respectively connected to the integrated circuit; wherein a respective lead line of the plurality of lead lines is connected to source electrodes of two switching transistors respectively from two different sensing multiplexers selected from the first sensing multiplexer, the second sensing multiplexer, and the third sensing multiplexer, and connected to source electrodes of two switching transistors respectively from the first data multiplexer and the second data multiplexer.

Optionally, the N number of sensing multiplexers comprise a first sensing multiplexer, a second sensing multiplexer, and a third sensing multiplexer; the first sensing multiplexer is configured to be turned on to allow transmission of first residual voltage signals respectively from first columns of subpixels to the integrated circuit; the second sensing multiplexer is configured to be turned on to allow transmission of second residual voltage signals respectively from second columns of subpixels and fourth residual voltage signals respectively from fourth columns of subpixels to the integrated circuit; the third sensing multiplexer is configured to be turned on to allow transmission of third residual voltage signals respectively from third columns of subpixels to the integrated circuit; a respective first column comprises subpixels of a first color and subpixels of a third color alternately arranged along a column direction; a respective second column comprises subpixels of a second color; a respective third column comprises subpixels of the third color and subpixels of the first color alternately arranged along the column direction; and a respective fourth column comprises subpixels of the second color.

Optionally, the N number of sensing multiplexers comprise a first sensing multiplexer, a second sensing multiplexer, and a third sensing multiplexer; the first sensing multiplexer is configured to be turned on to allow transmission of first residual voltage signals respectively from first columns of subpixels to the integrated circuit; the second sensing multiplexer is configured to be turned on to allow transmission of second residual voltage signals respectively from second columns of subpixels and fourth residual voltage signals respectively from fourth columns of subpixels to the integrated circuit; the third sensing multiplexer is configured to be turned on to allow transmission of third residual voltage signals respectively from third columns of subpixels to the integrated circuit; a respective first column comprises subpixels of a first color and subpixels of a third color alternately arranged along a column direction; a respective second column comprises subpixels of a second color; a respective third column comprises subpixels of the third color and subpixels of the first color alternately arranged along the column direction; a respective fourth column comprises subpixels of the second color; the M number of data multiplexers comprise a first data multiplexer and a second data multiplexer; the first data multiplexer is configured to be turned on to allow transmission of data signals respectively to odd-numbered columns of subpixels; and the second data multiplexer is configured to be turned on to allow transmission of data signals respectively to even-numbered columns of subpixels.

Optionally, the display apparatus further comprises a plurality of lead lines respectively connected to the integrated circuit; wherein a respective lead line of the plurality of lead lines is connected to source electrodes of two switching transistors respectively from two different sensing multiplexers selected from the first sensing multiplexer, the second sensing multiplexer, and the third sensing multiplexer, and connected to source electrodes of two switching transistors respectively from the first data multiplexer and the second data multiplexer.

In another aspect, the present disclosure provides a peripheral sensing circuit, comprising a plurality of first reference transistors, source electrodes of the plurality of first reference transistors respectively connected to a reference signal line, drain electrodes of the plurality of first reference transistors respectively connected to a plurality of sensing signal lines respectively connected to a plurality of columns of subpixels, and gate electrodes of the plurality of first reference transistors respectively connected to a first reference control signal line; and N number of sensing multiplexers, N≥2; wherein the N number of sensing multiplexers are configured to be time-sequentially turned on to allow transmission of residual voltage signals respectively from a plurality of columns of subpixels to an integrated circuit respectively through the plurality of sensing signal lines.

Optionally, the peripheral sensing circuit further comprises a plurality of second reference transistors, source electrodes of the plurality of second reference transistors respectively connected to the reference signal line, drain electrodes of the plurality of second reference transistors respectively connected to the plurality of sensing signal lines, and gate electrodes of the plurality of second reference transistors respectively connected to a second reference control signal line.

Optionally, the peripheral sensing circuit further comprises M number of data multiplexers, M≥2; wherein the M number of data multiplexers are configured to be time-sequentially turned on to allow transmission of data signals respectively to the plurality of columns of subpixels respectively through a plurality of data lines.

In another aspect, the present disclosure provides a pixel driving circuit, comprising a storage capacitor; a driving transistor; a sensing transistor having a gate electrode connected to a sensing control signal line, a source electrode connected to an anode of a respective light emitting element, and a drain electrode connected to a respective sensing signal line; wherein the sensing transistor is configured to obtain a residual voltage signal at the anode of the respective light emitting element, after the anode is charged by an initial voltage signal for a first period of time, and allowed to discharge for a second period of time upon discontinuation of the initial voltage signal.

BRIEF DESCRIPTION OF THE FIGURES

The following drawings are merely examples for illustrative purposes according to various disclosed embodiments and are not intended to limit the scope of the present invention.

FIG. 15 is a timing diagram of operating a display apparatus in an image display phase in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a method for image display in a display apparatus, a display apparatus, a peripheral sensing circuit, and a pixel driving circuit that substantially obviate one or more of the problems due to limitations and disadvantages of the related art. In one aspect, the present disclosure provides a pixel driving circuit. In some embodiments, the pixel driving circuit includes a storage capacitor; a driving transistor; and a sensing transistor having a gate electrode connected to a sensing control signal line, a source electrode connected to an anode of a respective light emitting element, and a drain electrode connected to the respective sensing signal line. Optionally, the sensing transistor is configured to obtain a residual voltage signal at the anode of the respective light emitting element, after the anode is charged by an initial voltage signal for a first period of time, and allowed to discharge for a second period of time upon discontinuation of the initial voltage signal.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is a 8T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
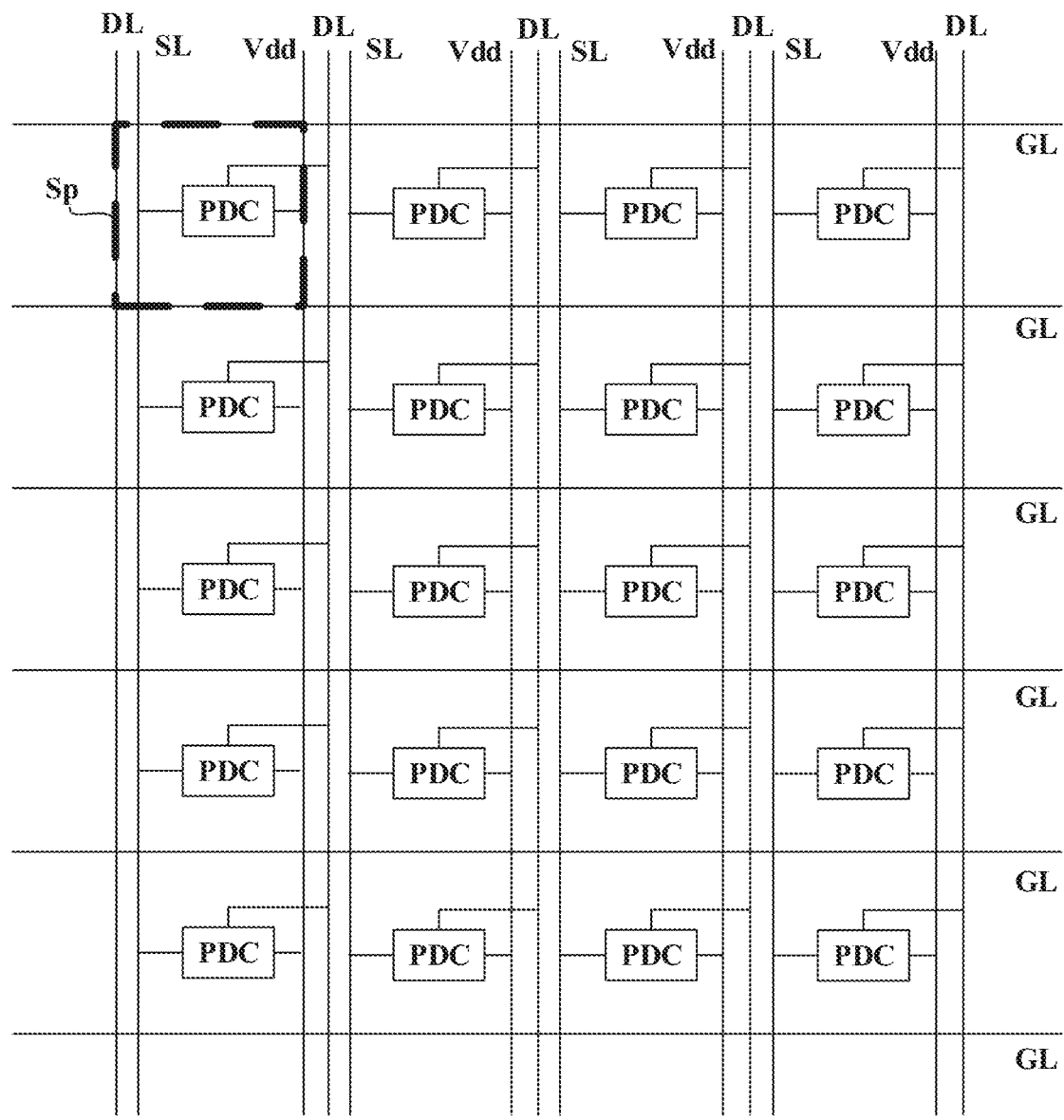
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, a plurality of sensing signal lines SL, a plurality of voltage supply line (e.g., a high voltage supply line Vdd), and a respective second voltage supply line (e.g., a low voltage supply line Vss), each of which electrically connected to the respective pixel driving circuit PDC. Light emission in a respective subpixel sp is driven by a respective pixel driving circuit PDC. In one example, a high voltage signal (e.g., a VDD signal) is input, through the high voltage support line Vdd, to the respective pixel driving circuit PDC connected to an anode of the light emitting element; a low voltage signal (e.g., a VSS signal) is input, through a low voltage supply line Vss, to a cathode of the light emitting element. A voltage difference between the high voltage signal (e.g., the VDD signal) and the low voltage signal (e.g., the VSS signal) is a driving voltage ΔV that drives light emission in the light emitting element. The array substrate according to the present disclosure includes a plurality of sensing signal lines SL respectively connected to sensing sub-circuits in the plurality of pixel driving circuits.

Figure 2:
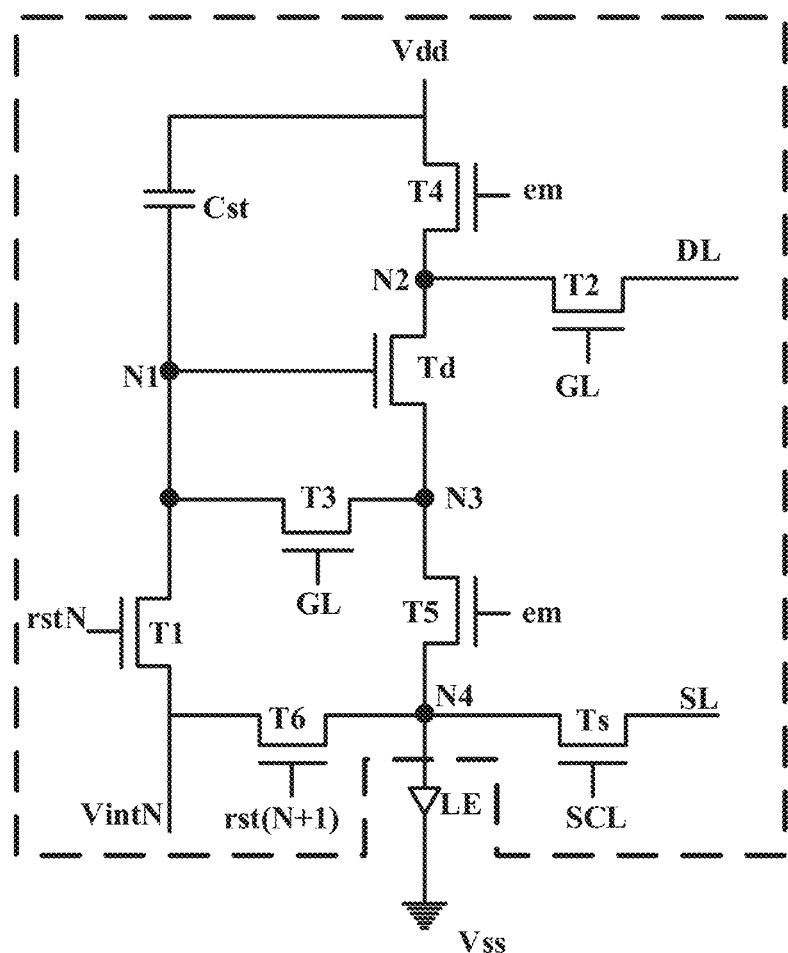
FIG. 2 is a circuit diagram illustrating the structure of a pixel driving circuit in some embodiments according to the present disclosure.

FIG. 2 is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a first reset control signal line rst1, a source electrode connected to a first reset signal line Vint1, and a drain electrode connected to a first capacitor electrode Ce1 of the storage capacitor Cst and a gate electrode of the driving transistor Td; a second transistor T2 having a gate electrode connected to a gate line GL, a source electrode connected to the data line DL, and a drain electrode connected to a source electrode of the driving transistor Td; a third transistor T3 having a gate electrode connected to the gate line GL, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a light emitting control signal line em, a source electrode connected to the voltage supply line Vdd, and a drain electrode connected to the source electrode of the driving transistor Td and the drain electrode of the second transistor T2; a fifth transistor T5 having a gate electrode connected to the light emitting control signal line em, a source electrode connected to drain electrodes of the driving transistor Td and the third transistor T3, and a drain electrode connected to an anode of a light emitting element LE; and a sixth transistor T6 having a gate electrode connected to a second reset control signal line rst2, a source electrode connected to a second reset signal line Vint2, and a drain electrode connected to the drain electrode of the fifth transistor and the anode of the light emitting element LE. The second capacitor electrode Ce2 is connected to the voltage supply line Vdd and the source electrode of the fourth transistor T4. The pixel driving circuit further includes a sensing transistor Ts having a gate electrode connected to a respective one of the plurality of sensing control signal lines SCL, a source electrode connected to an anode of a respective light emitting element LE, and a drain electrode connected to a respective sensing signal line SL.

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, the drain electrode of the sensing transistor Ts, and the anode of the light emitting element LE.

Figure 3A:
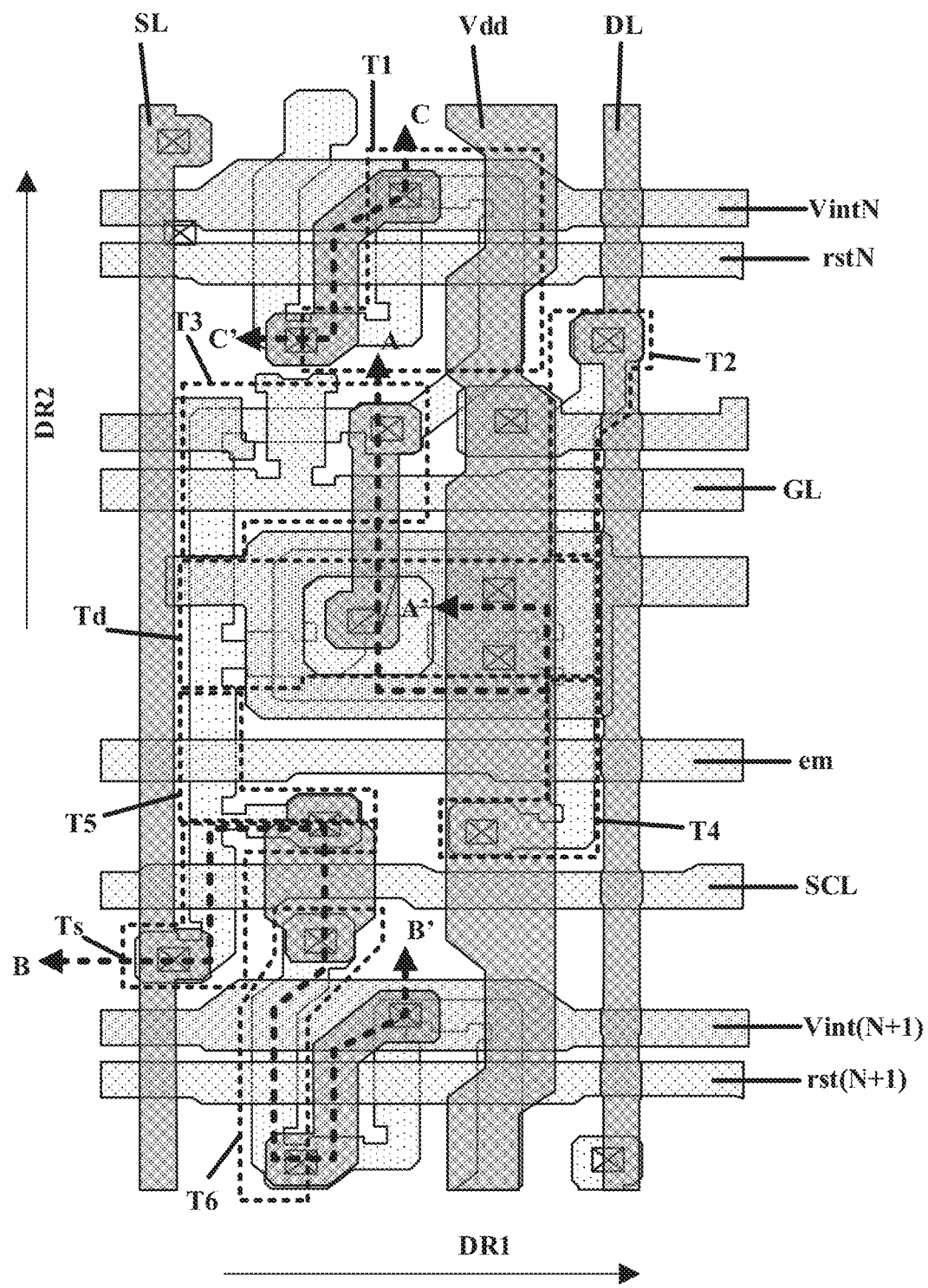
FIG. 3A is a diagram illustrating the structure of a respective subpixel of an array substrate in some embodiments according to the present disclosure.

FIG. 3A is a diagram illustrating the structure of a respective subpixel of an array substrate in some embodiments according to the present disclosure. Referring to FIG. 3A, the array substrate in some embodiments includes a plurality of subpixels (e.g., a red subpixel, a green subpixel, and a blue subpixel). The array substrate in some embodiments includes a plurality of gate lines GL respectively extending along a first direction DR1, a plurality of data lines DL respectively extending along a second direction DR2; and a plurality of voltage supply lines Vdd respectively extending along the second direction DR2. Optionally, the array substrate further includes a plurality of reset control signal lines (including a reset control signal line of a present stage rstN and a reset control signal line of a next stage rst(N+1)) respectively extending along the first direction DR1; a plurality of reset signal lines (including a reset signal line of a present stage VintN and a reset signal line of a next stage Vinit(N+1)) respectively extending along the first direction DR1; and a plurality of light emitting control signal lines em respectively extending along the first direction DR1. Corresponding positions of the plurality of transistors in a pixel driving circuit are depicted in FIG. 3A. The pixel driving circuit includes the first transistor T1, the second transistor T2, the third transistor T3, the fourth transistor T4, the fifth transistor T5, the sixth transistor T6, the sensing transistor Ts, and the driving transistor Td.

Figure 3B:
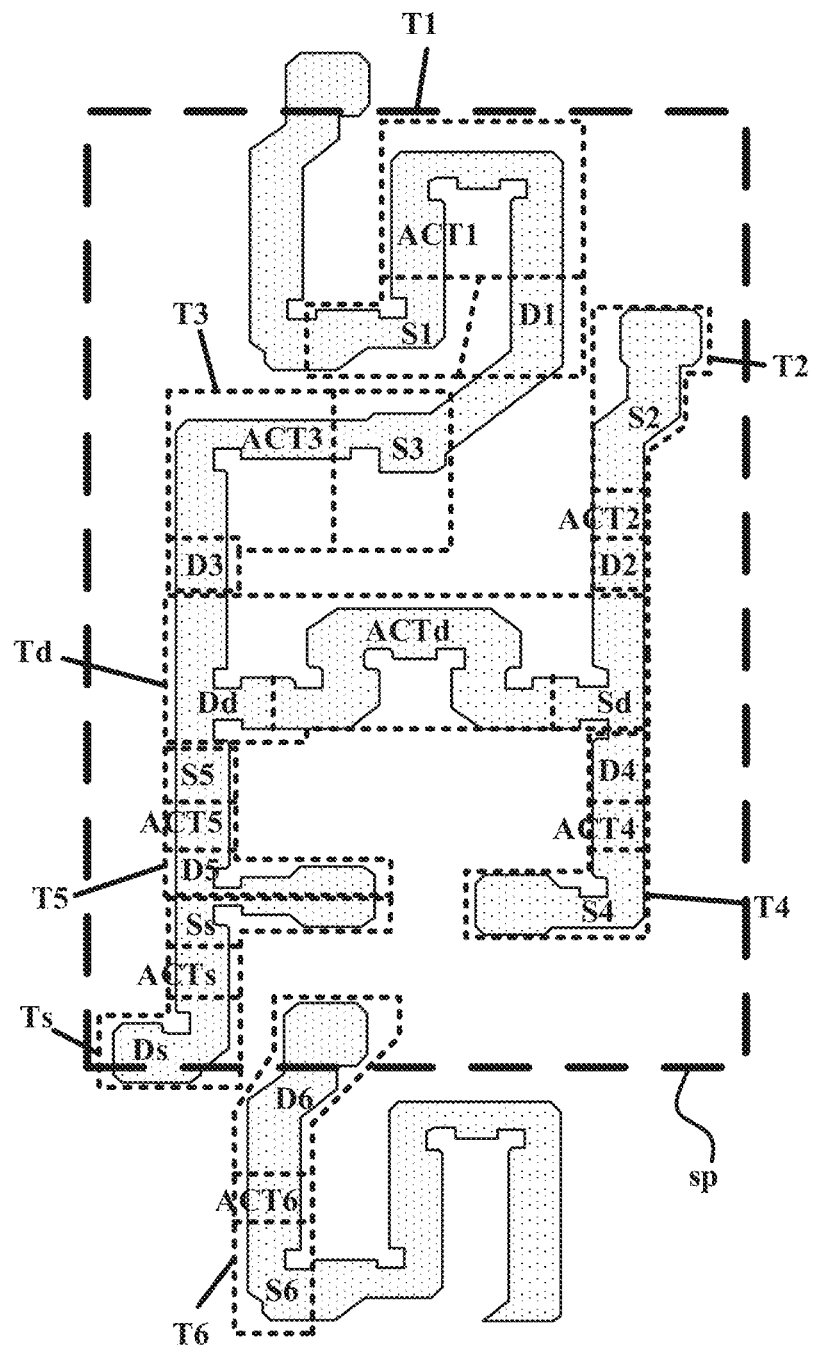
FIG. 3B is a diagram illustrating the structure of a semiconductor material layer in a respective subpixel of an array substrate depicted in FIG. 3A.
Figure 3C:
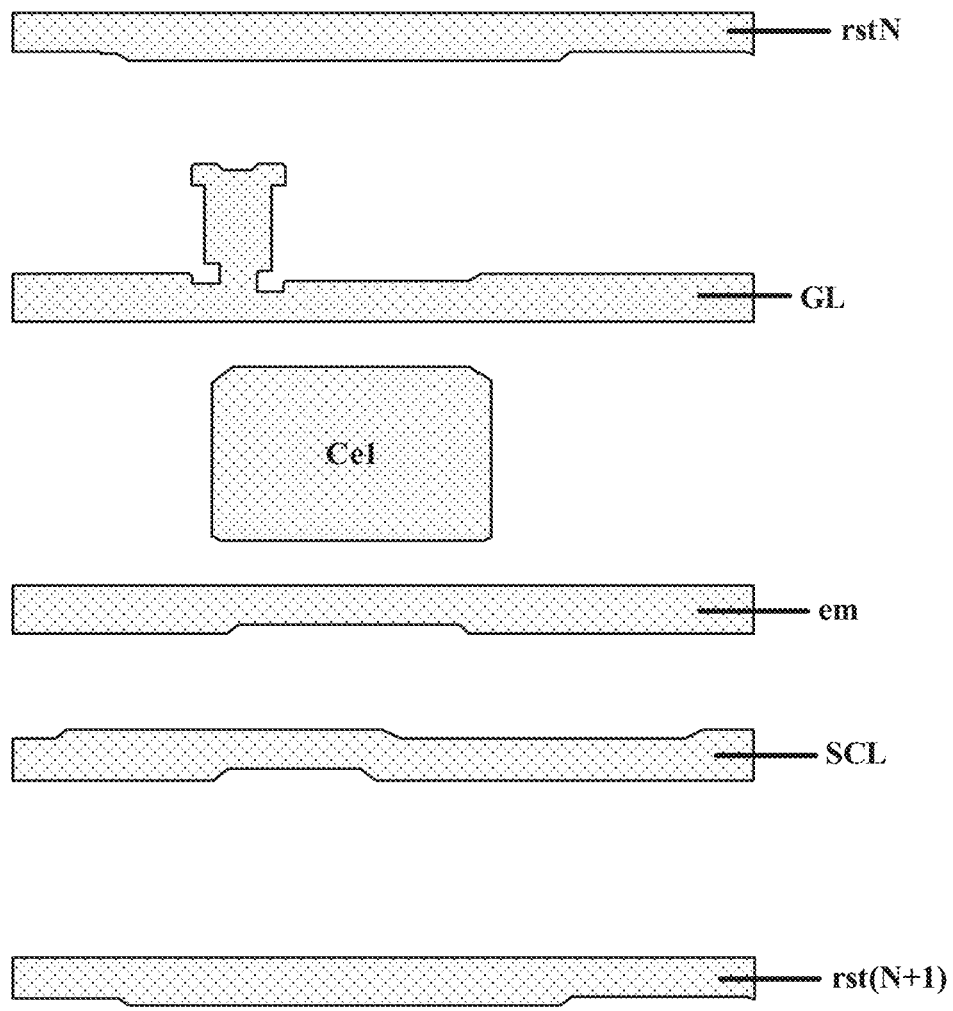
FIG. 3C is a diagram illustrating the structure of a first conductive layer in a respective subpixel of an array substrate depicted in FIG. 3A.
Figure 3D:
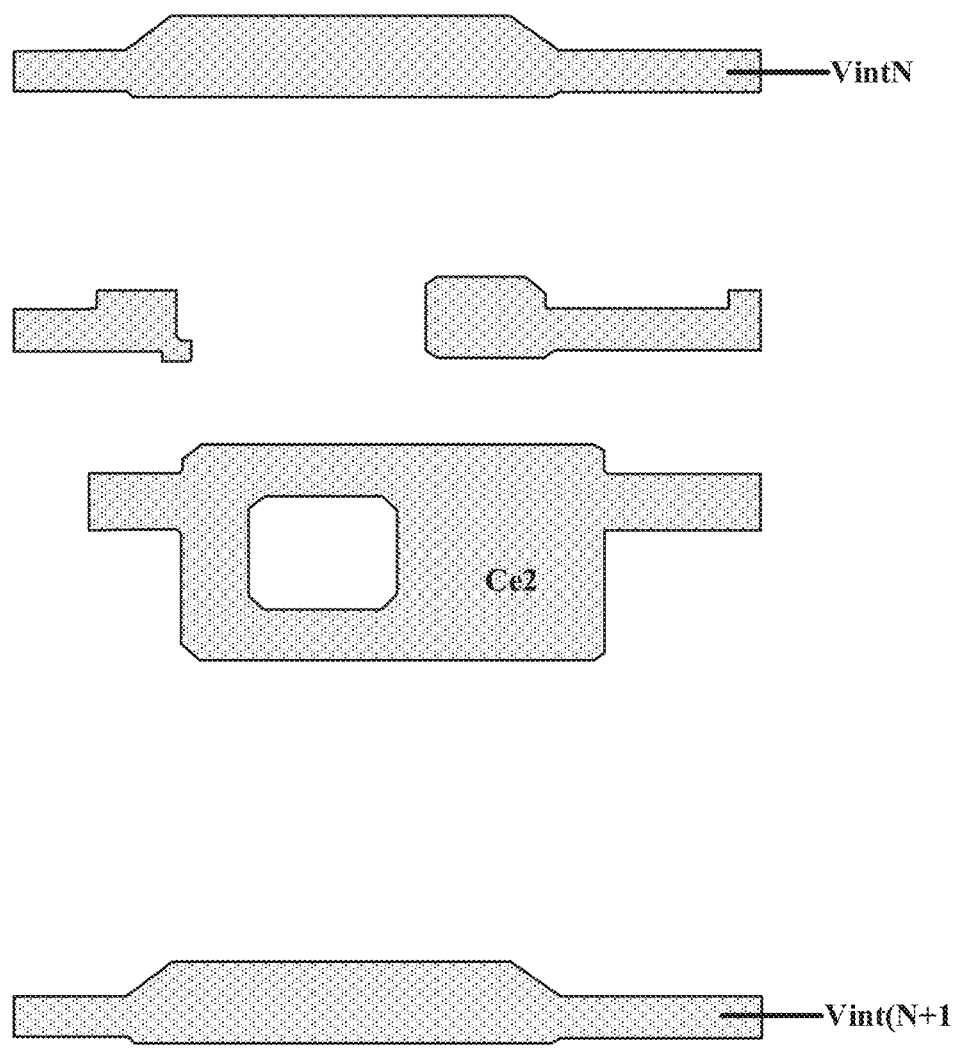
FIG. 3D is a diagram illustrating the structure of a second conductive layer in a respective subpixel of an array substrate depicted in FIG. 3A.
Figure 3E:
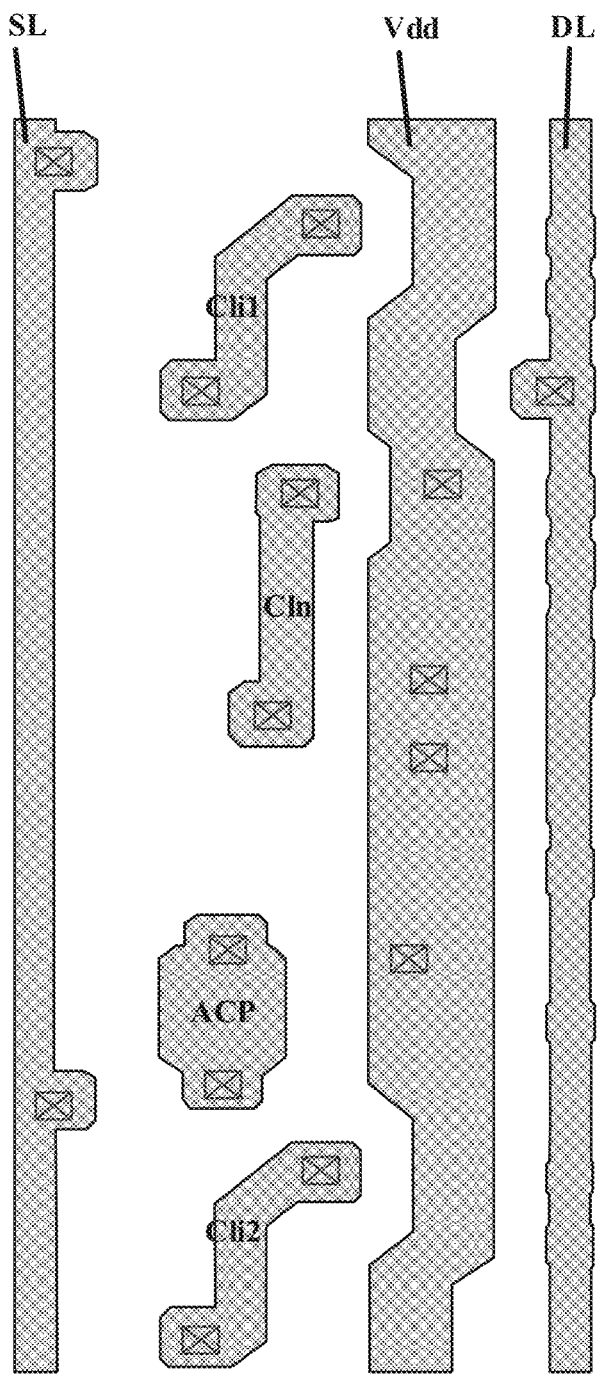
FIG. 3E is a diagram illustrating the structure of a signal line layer in a respective subpixel of an array substrate depicted in FIG. 3A.
Figure 4A:
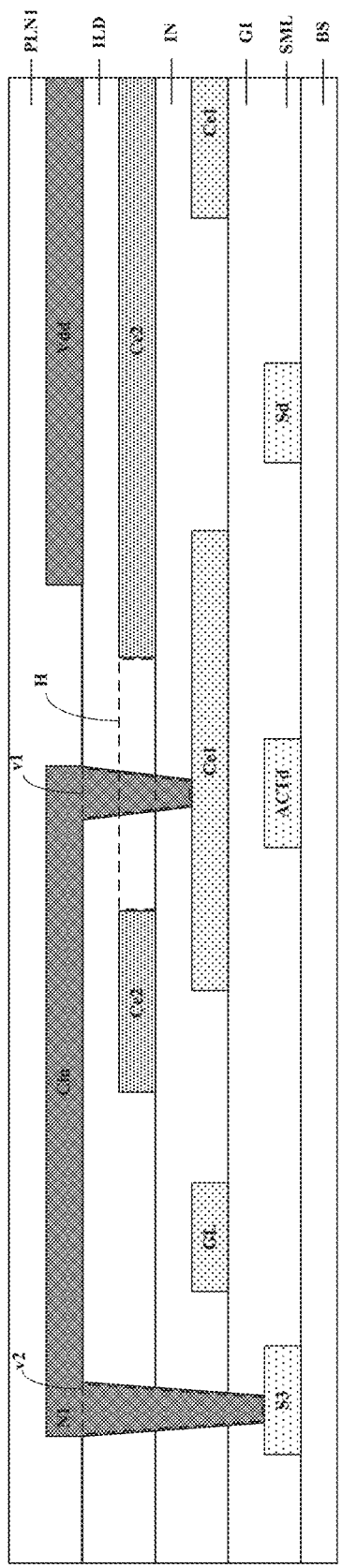
FIG. 4A is a cross-sectional view along an A-A' line in FIG. 3A.
Figure 4B:
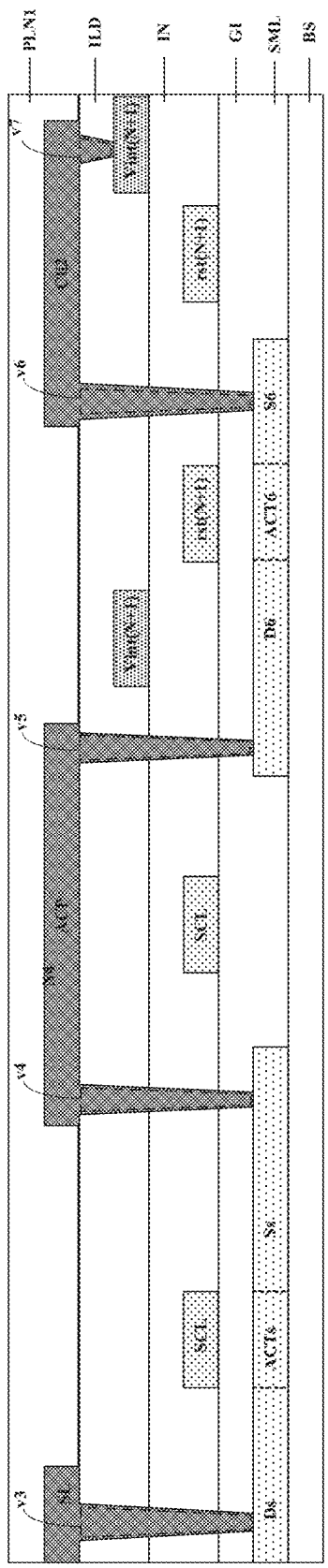
FIG. 4B is a cross-sectional view along a B-B' line in FIG. 3A.

FIG. 3B is a diagram illustrating the structure of a semiconductor material layer in a respective subpixel of an array substrate depicted in FIG. 3A. FIG. 3C is a diagram illustrating the structure of a first conductive layer in a respective subpixel of an array substrate depicted in FIG. 3A. FIG. 3D is a diagram illustrating the structure of a second conductive layer in a respective subpixel of an array substrate depicted in FIG. 3A. FIG. 3E is a diagram illustrating the structure of a signal line layer in a respective subpixel of an array substrate depicted in FIG. 3A. FIG. 4A is a cross-sectional view along an A-A' line in FIG. 3A. FIG. 4B is a cross-sectional view along a B-B' line in FIG. 3A. Referring to FIG. 3A to FIG. 3E, and FIG. 4A to FIG. 4B, in some embodiments, the array substrate includes a base substrate BS, a semiconductor material layer SML on the base substrate BS, a gate insulating layer GI on a side of the semiconductor material layer SML away from the base substrate BS, a first conductive layer on a side of the gate insulating layer GI away from the semiconductor material layer SML, an insulating layer IN on a side of the first conductive layer away from the gate insulating layer GI, a second conductive layer on a side of the insulating layer IN away from the first conductive layer, an inter-layer dielectric layer ILD on a side of the second conductive layer away from the insulating layer IN, a signal line layer on a side of the inter-layer dielectric layer ILD away from the second conductive layer, a first planarization layer PLN1 on a side of the signal line layer away from the inter-layer dielectric layer ILD.

Referring to FIG. 2, FIG. 3A, and FIG. 3B, in some embodiments, in a respective subpixel sp, the semiconductor material layer has a unitary structure. In FIG. 3B, the respective subpixel sp is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, the sensing transistor Ts, and the driving transistor Td. The respective subpixel sp is further annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The sensing transistor Ts includes an active layer ACTs, a source electrode Ss, and a drain electrode Ds. The driving transistor Td includes an active layer ACTd, a source electrode Sd, and a drain electrode Dd. In one example, the active layers (ACT1, ACT2, ACT3, ACT4, ACT5, ACT6, ACTs, and ACTd), the source electrodes (S1, S2, S3, S4, S5, S6, Ss, and Sd), and the drain electrodes (D1, D2, D3, D4, D5, D6, Ds, and Dd) of the transistors (T1, T2, T3, T4, T5, T6, Ts, and Td) in the respective subpixel sp are parts of a unitary structure in the respective subpixel. In another example, the active layers (ACT1, ACT2, ACT3, ACT4, ACT5, ACT6, ACTs, and ACTd), the source electrodes (S1, S2, S3, S4, S5, S6, Ss, and Sd), and the drain electrodes (D1, D2, D3, D4, D5, D6, Ds, and Dd) of the transistors (T1, T2, T3, T4, T5, T6, Ts, and Td) are in a same layer.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Referring to FIG. 2, FIG. 3A, FIG. 3C, FIG. 4A, and FIG. 4B, the first conductive layer in some embodiments includes a plurality of gate lines GL, a plurality of reset control signal lines (including a reset control signal line of a present stage rstN and a reset control signal line of a next stage rst(N+1)), a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of reset control signal lines, the plurality of light emitting control signal lines em, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Referring to FIG. 2, FIG. 3A, and FIG. 3D, the second conductive layer in some embodiments includes a plurality of reset signal lines (including a reset signal line of a present stage VintN and a reset signal line of a next stage Vinit(N+1)), and a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of reset signal lines and the second capacitor electrode Ce2 are in a same layer.

Referring to FIG. 2, FIG. 3A, FIG. 3B, and FIG. 3E, the signal line layer in some embodiments includes a plurality of voltage supply lines Vdd, a plurality of data lines DL, a plurality of sensing signal lines SL, a node connecting line Cln, a first initialization connecting line Cli1, a second initialization connecting line Cli2, and an anode contact pad ACP. The node connecting line Cln connects the first capacitor electrode Ce1 and the source electrode of the third transistor T3 in a respective subpixel sp together. The first initialization connecting line Cli1 connects a respective one of the plurality of reset signal lines (e.g., the reset signal line of the present stage VintN) and the source electrode of the first transistor T1 in the respective subpixel sp together. The second initialization connecting line Cli2 connects a respective one of the plurality of reset signal lines (e.g., the reset signal line of the next stage Vinit(N+1)) and the source electrode of the sixth transistor T6 in the respective subpixel sp together. The anode contact pad ACP connects a source electrode of the fifth transistor T5 in the respective subpixel sp to an anode in the respective subpixel sp. Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the plurality of data lines DL, the plurality of sensing signal lines SL, the node connecting line Cln, the first initialization connecting line Cli1, the second initialization connecting line Cli2, and the anode contact pad ACP are in a same layer.

Figure 4C:
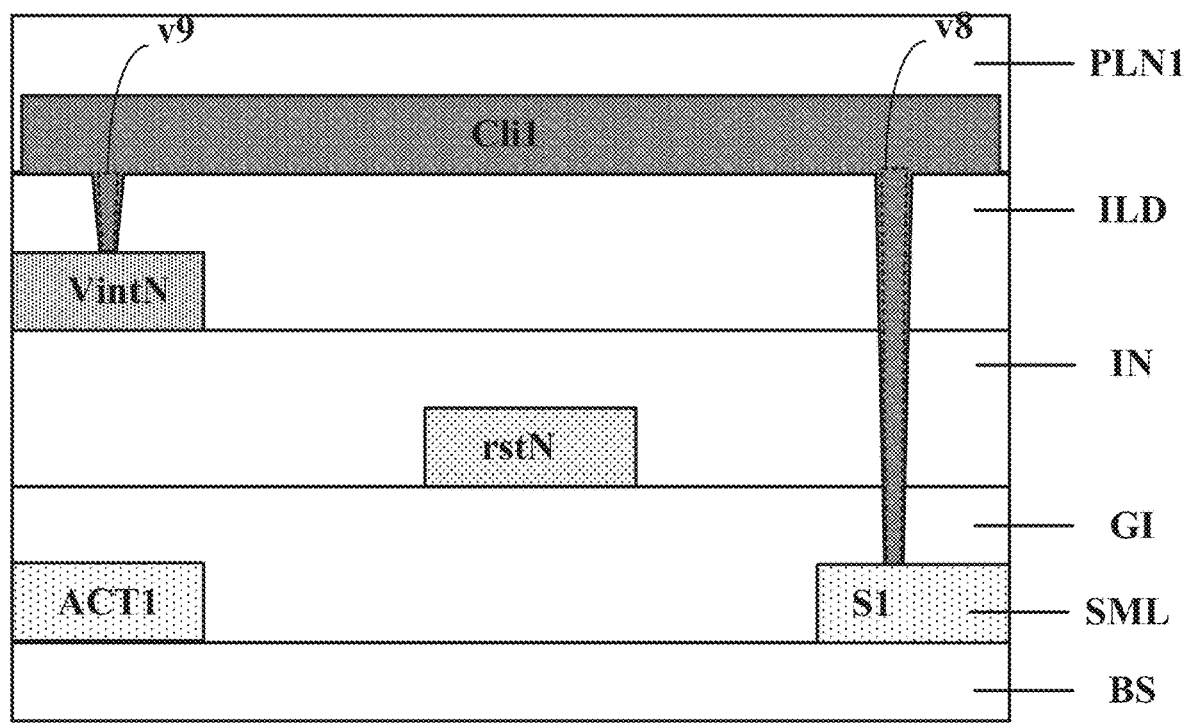
FIG. 4C is a cross-sectional view along a C-C' line in FIG. 3A.

FIG. 4C is a cross-sectional view along a C-C' line in FIG. 3A. Referring to FIG. 2A, FIG. 3A, FIG. 3E, and FIG. 4C, in some embodiments, the first initialization connecting line Cli1 connects the reset signal line of the present stage VintN and the source electrode S1 of the first transistor T1 in a respective subpixel together. The reset signal line of the present stage VintN is configured to provide a reset signal to the source electrode S1 of the first transistor T1 in the respective subpixel, through the first initialization connecting line Cli1. Optionally, the first initialization connecting line Cli1 is connected to the reset signal line of the present stage VintN through a ninth via v9 extending through the inter-layer dielectric layer ILD. Optionally, the first initialization connecting line Cli1 is connected to the source electrode S1 of the first transistor T1 in the respective subpixel through an eighth via v8 extending through the inter-layer dielectric layer ILD, the insulating layer IN, and the gate insulating layer GI.

Referring to FIG. 2, FIG. 3A, FIG. 3E, and FIG. 4B, in some embodiments, the second initialization connecting line Cli2 connects the reset signal line of the next stage Vinit(N+1) and the source electrode S6 of the sixth transistor T6 in a respective subpixel together. The reset signal line of the next stage Vinit(N+1) is configured to provide a reset signal to the source electrode S6 of the sixth transistor T6 in the respective subpixel, through the second initialization connecting line Cli2. Optionally, the second initialization connecting line Cli2 is connected to the reset signal line of the next stage Vinit(N+1) through a seventh via v7 extending through the inter-layer dielectric layer ILD. Optionally, the second initialization connecting line Cli2 is connected to the source electrode S6 of the sixth transistor T6 in the respective subpixel through a sixth via v6 extending through the inter-layer dielectric layer ILD, the insulating layer IN, and the gate insulating layer GI.

Referring to FIG. 2A, FIG. 3A, FIG. 3C, FIG. 3D, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the signal line layer includes a node connecting line Cln on a side of the inter-layer dielectric layer ILD away from the second capacitor electrode Ce2. The node connecting line Cln is in a same layer as the plurality of voltage supply lines Vdd and the plurality of data lines DL. Optionally, the array substrate further includes a first via v1 in the hole region H and extending through the inter-layer dielectric layer ILD and the insulating layer IN. Optionally, the node connecting line Cln is connected to the first capacitor electrode Ce1 through the first via v1. In some embodiments, the first capacitor electrode Ce1 is on a side of the gate insulating layer IN away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and is connected node connecting line Cln is connected the semiconductor material layer SML through the second via v2. Optionally, the node connecting line Cln is connected to the source electrode S3 of third transistor, as depicted in FIG. 4A.

Referring to Referring to FIG. 2A, FIG. 3A, FIG. 3D, and FIG. 4B, in some embodiments, a respective one of the plurality of sensing signal lines SL is connected to a drain electrode Ds of the sensing transistor Ts through a third via v3 extending through the inter-layer dielectric layer ILD, the insulating layer IN, and the gate insulating layer GI. Optionally, the sensing transistor Ts is configured to obtain a residual voltage signal at an anode of a respective light emitting element in the respective subpixel, after the anode is charged by an initial voltage signal for a first period of time, and allowed to discharge for a second period of time upon discontinuation of the initial voltage signal. Optionally, the respective one of the plurality of sensing signal lines SL is configured to transmit the residual voltage signal to an integrated circuit. Optionally, in a subsequent image display phase, the integrated circuit is configured to compensate a data signal provided to the respective subpixel in the subsequent image display phase based on the residual voltage difference. As used herein, the term "subsequent image display phase" may be an immediate next image display phase, but is not limited to the immediate next image display phase. The "subsequent image display phase" may be any image display phase subsequent to a present image display phase.

Referring to Referring to FIG. 2A, FIG. 3A, FIG. 3D, and FIG. 4B, in some embodiments, the anode contact pad ACP is connected to a source electrode Ss of the sensing transistor Ts through a fourth via v4 extending through the inter-layer dielectric layer ILD, the insulating layer IN, and the gate insulating layer GI, and is connected to a drain electrode D6 of the sixth transistor T6 through a fifth via v5 extending through the inter-layer dielectric layer ILD, the insulating layer IN, and the gate insulating layer GI. The anode contact pad ACP crosses over a respective one of the plurality of sensing control signal lines SCL. In one example, the anode contact pad ACP extends substantially along the second direction DR2, and the respective one of the plurality of sensing control signal lines SCL extends substantially along the first direction DR1. As shown in FIG. 4B, an orthographic projection of the anode contact pad ACP on the base substrate BS partially overlaps with an orthographic projection of the respective one of the plurality of sensing control signal lines SCL on the base substrate BS.

In another aspect, the present disclosure provides a display apparatus. In some embodiments, the display apparatus includes a plurality of pixel driving circuits; a plurality of sensing signal lines; and an integrated circuit. Optionally, a respective pixel driving circuit PDC includes a sensing sub-circuit Ts configured to obtain a residual voltage signal at an anode of a respective light emitting element. Optionally, a respective sensing signal line is configured to transmit the residual voltage signal to the integrated circuit. Optionally, the integrated circuit is configured to compensate a data signal provided to a respective subpixel in a subsequent image display phase based on a residual voltage difference between a value of the residual voltage signal and a reference residual voltage value.

Figure 5:
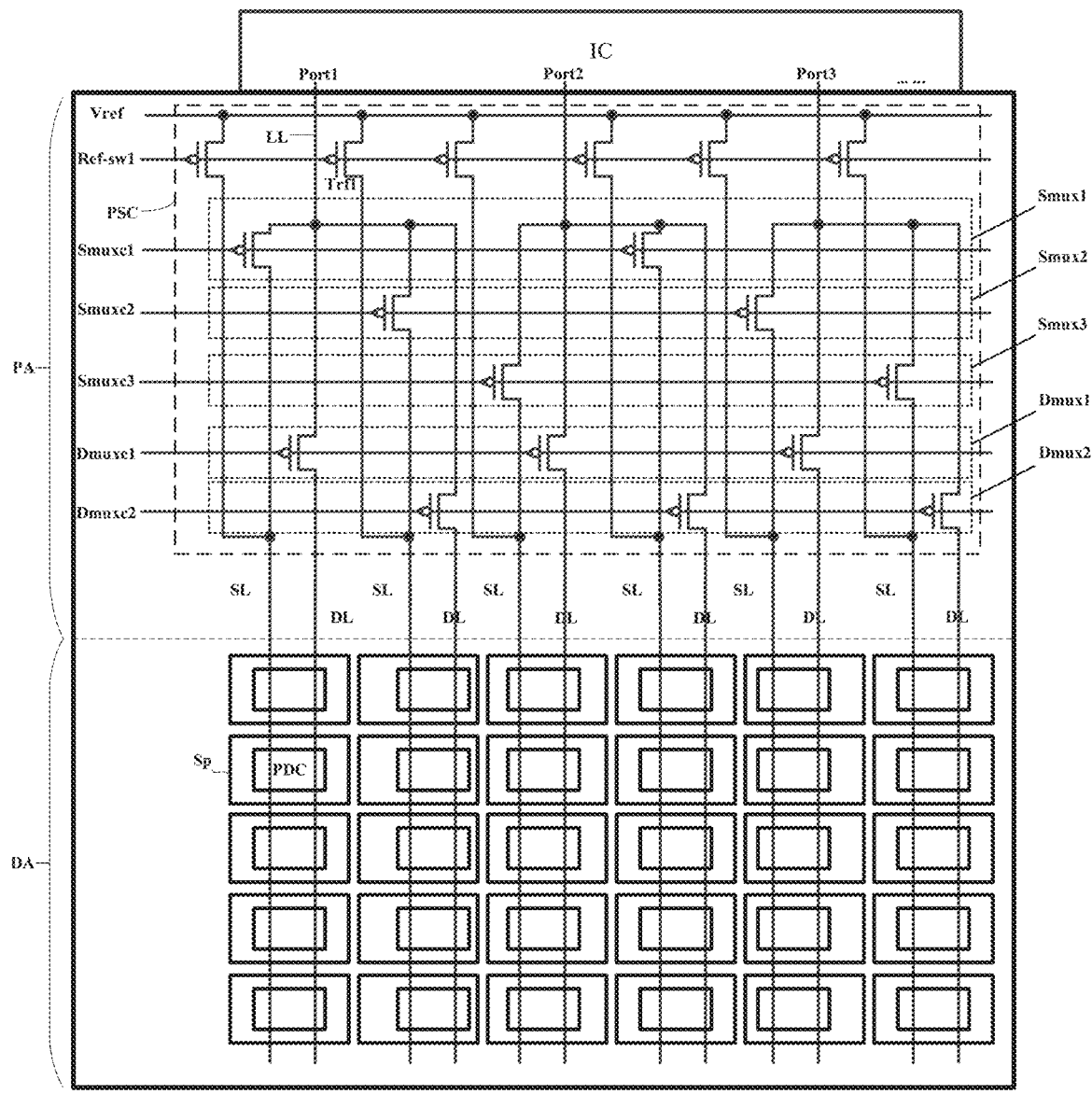
FIG. 5 is a schematic diagram illustrating the structure of a display apparatus in some embodiments according to the present disclosure.

FIG. 5 is a schematic diagram illustrating the structure of a display apparatus in some embodiments according to the present disclosure. Referring to FIG. 5, the display apparatus in some embodiments includes a display area DA and a peripheral area PA. The display apparatus in some embodiments includes an integrated circuit IC connected to the peripheral area PA, a plurality of sensing signal lines SL extending into the display area DA and connected to a plurality of columns of subpixels. The plurality of sensing signal lines SL are connected to the integrated circuit IC through a peripheral sensing circuit PSC. As used herein the term "peripheral area" refers to an area of a display apparatus where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas. As used herein, the term "display area" refers to an area of a display apparatus where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

In some embodiments, the integrated circuit IC is a data driving integrated circuit, the display apparatus further includes a plurality of data lines DL extending into the display area DA and connected to a plurality of columns of subpixels. The plurality of data lines DL are connected to the integrated circuit IC through the peripheral sensing circuit PSC.

Figure 6:
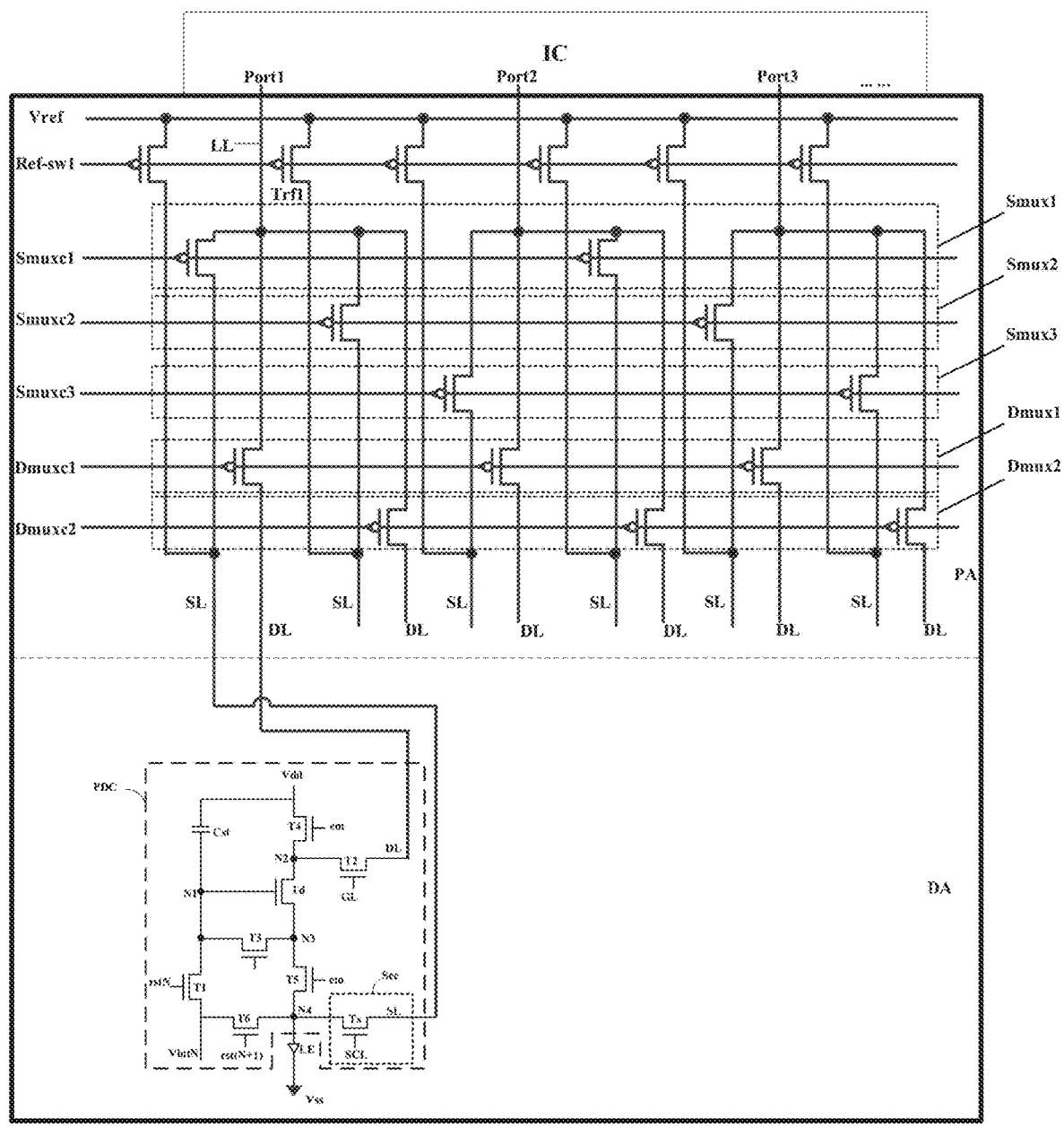
FIG. 6 is a schematic diagram illustrating electrical connection between an integrated circuit and a respective pixel driving circuit in a respective subpixel in a display apparatus in some embodiments according to the present disclosure.

FIG. 6 is a schematic diagram illustrating electrical connection between an integrated circuit and a respective pixel driving circuit in a respective subpixel in a display apparatus in some embodiments according to the present disclosure. As shown in FIG. 6, in some embodiments, a respective pixel driving circuit PDC includes a sensing sub-circuit Sec configured to obtain a residual voltage signal at an anode of a respective light emitting element in the respective subpixel. A respective sensing signal line of the plurality of sensing signal lines SL is configured to transmit the residual voltage signal to the integrated circuit IC. The integrated circuit IC is configured to compensate a data signal provided to a respective subpixel in a subsequent image display phase based on a residual voltage difference between a value of the residual voltage signal and a reference residual voltage value.

In some embodiments, the sensing sub-circuit Scc includes a sensing transistor Ts having a gate electrode connected to the respective one of the plurality of sensing control signal lines SCL, a source electrode connected to the anode of the respective light emitting element, and a drain electrode connected to the respective sensing signal line of the plurality of sensing signal lines SL. As shown in FIG. 6, the drain electrode of the sensing transistor Ts is connected to a fourth node N4 in the respective pixel driving circuit PDC. In one example, the fourth node N4 is connected to the drain electrode of the fifth transistor T5, the drain electrode of the sixth transistor T6, the drain electrode of the sensing transistor Ts, and the anode of the light emitting element LE.

Light emitting efficiencies of light emitting elements (e.g., organic light emitting diodes) in a display apparatus decrease as the display apparatus is used over time, resulting in a decreased luminance with a same data signal provided to the light emitting elements. Subpixels of different colors are observed to have light emitting efficiencies decreased with different degrees, respectively. For example, blue light emitting elements have the largest decrease in light emitting efficiencies as compared to red light emitting elements and green light emitting elements, leading to color shift in image display.

The present disclosure provides a novel pixel driving circuit that is capable of sensing the decreases in light emitting efficiencies respectively in individual light emitting elements of different colors. The integrated circuit, based on the signals detected by the pixel driving circuit, can compensate the data signals provided to the individual light emitting elements to correct luminance decrease and color shift issues.

Accordingly, in another aspect, the present disclosure provides a method for image display in a display apparatus. In some embodiments, the image display in the display apparatus includes an image display phase and a sensing phase. In the image display phase, the display apparatus displays a frame of image, e.g., displaying a subpixel image in a respective subpixel in the image display phase. In some embodiments, in the sensing phase subsequent to the image display phase, the method includes providing an initial voltage signal to an anode of a respective light emitting element in the respective subpixel for a first period of time; allowing the anode of a respective light emitting element to discharge for a second period of time, upon discontinuation of the initial voltage signal; obtaining a residual voltage signal at the anode of the respective light emitting element at the end of the second period of time by a sensing sub-circuit of a respective pixel driving circuit; and transmitting the residual voltage signal to an integrated circuit. Optionally, in a subsequent image display phase, the method further comprises compensating a data signal provided to the respective subpixel in the subsequent image display phase by the integrated circuit based on a residual voltage difference between a value of the residual voltage signal and a reference residual voltage value.

Figure 7:
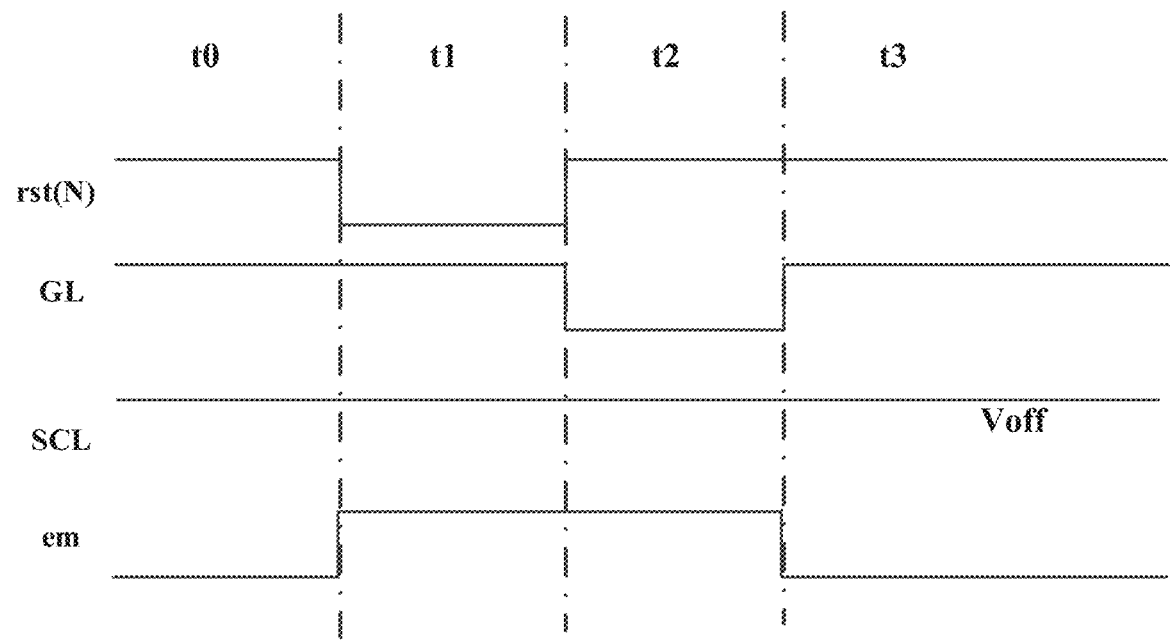
FIG. 7 is a timing diagram of operating a display apparatus in an image display phase in some embodiments according to the present disclosure.

FIG. 7 is a timing diagram of operating a display apparatus in an image display phase in some embodiments according to the present disclosure. Referring to FIG. 2 and FIG. 7, the image display phase in some embodiments includes an initial sub-phase t0, a reset sub-phase t1, a data write sub-phase t2, and a light emitting sub-phase t3. In the initial sub-phase t0, a turning-off reset control signal is provided through the reset control signal line of a present stage rstN to gate electrode of the first transistor T1 to turn off the first transistor T1. In the initial sub-phase t0, the gate line GL is provided with a turning-off signal, thus the second transistor T2 and the third transistor T3 are turned off.

In the reset sub-phase t1, a turning-on reset control signal is provided through the reset control signal line of the present stage rstN to the gate electrode of the first transistor T1 to turn on the first transistor T1; allowing an initialization voltage signal to pass from a source electrode of the first transistor T1 to a drain electrode of the first transistor T1 and in turn to the second capacitor electrode Ce2 and the gate electrode of the driving transistor Td. The gate electrode of the driving transistor Td is initialized. The first capacitor electrode Ce1 receives a high voltage signal from the voltage supply line Vdd. The second capacitor electrode Ce2 is charged in the reset sub-phase t1 due to an increasing voltage difference between the first capacitor electrode Ce1 and the second capacitor electrode Ce2. In the reset sub-phase t1, the gate line GL is provided with a turning-off signal, thus the second transistor T2 and the third transistor T3 are turned off. The light emitting control signal line em is provided with a high voltage signal to turn off the fourth transistor T4 and the fifth transistor T5.

In the data write sub-phase t2, the turning-off reset control signal is again provided through the reset control signal line of the present stage rstN to the gate electrode of the first transistor T1 to turn off the first transistor T1. The gate line GL is provided with a turning-on signal, thus the second transistor T2 and the third transistor T3 are turned on. A gate electrode and a drain electrode of the driving transistor Td are respectively connected with the source electrode and the drain electrode of the third transistor T3. Because the third transistor T3 is turned on in the data write sub-phase t2, the gate electrode and the drain electrode of the driving transistor Td are connected and short circuited, and only the PN junction between the gate electrode and a source electrode of the driving transistor Td is effective, thus rendering the driving transistor Td in a diode connecting mode. The second transistor T2 is turned on in the data write sub-phase t2. The data voltage signal transmitted through the data line DL is received by a source electrode of the second transistor T2, and in turn transmitted to the source electrode of the driving transistor Td, which is connected to the drain electrode of the second transistor T2. A node N2 connecting to the source electrode of the driving transistor Td has a voltage level of the data voltage signal. Because only the PN junction between the gate electrode and a source electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The light emitting control signal line em is provided with a high voltage signal to turn off the fourth transistor T4 and the fifth transistor T5.

In the light emitting sub-phase t3, the turning-off reset control signal is again provided through the reset control signal line of the present stage rstN to the gate electrode of the first transistor T1 to turn off the first transistor T1. The gate line GL is provided with a turning-off signal, the second transistor T2 and the third transistor T3 are turned off. The light emitting control signal line em is provided with a low voltage signal to turn on the fourth transistor T4 and the fifth transistor T5. The voltage level at the node N1 in the light emitting sub-phase t3 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the drain electrode of the driving transistor Td equals to a light emitting voltage of the light emitting element LE.

In the image display phase, the sensing transistor Ts remains turned off. A turning-off signal Voff is provided through a respective one of the plurality of sensing control signal lines SCL to the gate electrode of the sensing transistor Ts at all time during the image display phase.

Figure 8:
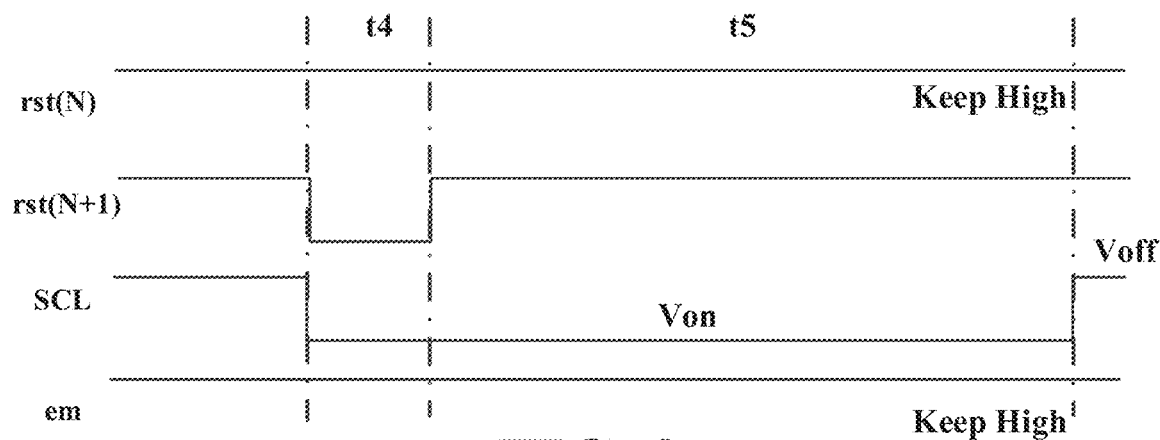
FIG. 8 is a timing diagram of operating a display apparatus in a sensing phase in some embodiments according to the present disclosure.
Figure 9:
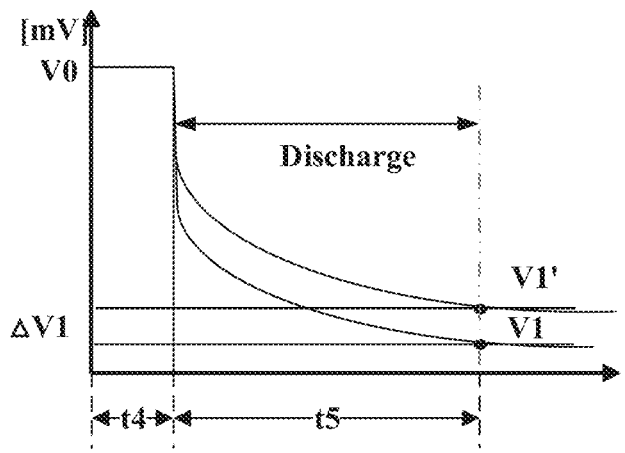
FIG. 9 illustrates a process of obtaining a residual voltage signal at an anode of a respective light emitting element in a display apparatus in some embodiments according to the present disclosure.

FIG. 8 is a timing diagram of operating a display apparatus in a sensing phase in some embodiments according to the present disclosure. FIG. 9 illustrates a process of obtaining a residual voltage signal at an anode of a respective light emitting element in a display apparatus in some embodiments according to the present disclosure. In some embodiments, the sensing phase includes a charging sub-phase t4 and a discharging sub-phase t5. The charging sub-phase t4 lasts for a first period of time, and the discharging sub-phase t5 lasts for a second period of time. In the sensing phase, the first transistor T1 remains turned off. A turning-off reset control signal is provided through the reset control signal line of the present stage rstN to the gate electrode of the first transistor T1 to turn off the first transistor T1.

Referring to FIG. 9, in the charging sub-phase t4, the method in some embodiments includes providing an initial voltage signal V0 to an anode of a respective light emitting element in the respective subpixel for a first period of time. In the discharging sub-phase t5, the method in some embodiments includes allowing the anode of a respective light emitting element to discharge for a second period of time, upon discontinuation of the initial voltage signal V0; obtaining a residual voltage signal V1 at the anode of the respective light emitting element at the end of the second period of time by a sensing sub-circuit of a respective pixel driving circuit; and transmitting the residual voltage signal V1 to an integrated circuit.

In some embodiments, the method further includes, in a subsequent image display phase, compensating a data signal provided to the respective subpixel in the subsequent image display phase by the integrated circuit based on a residual voltage difference between a value of the residual voltage signal and a reference residual voltage value. Referring to FIG. 9, in one example, the residual voltage difference $\Delta V$ between a value of the residual voltage signal V1 and a value of a reference residual voltage V1'. In one example, the reference residual voltage V1' may be a value of a residual voltage signal measured at an earlier time point, for example, at an initial time when the display apparatus was first used or at a time manufacturing of the display apparatus was finished.

In one example, a look-up table containing various compensation values corresponding to various residual voltage differences may be stored in the integrated circuit. The integrated circuit is configured to compensate data signals based on the residual voltage difference $\Delta V$ and the look-up table.

Referring to FIG. 2, FIG. 8, and FIG. 9, in the sensing phase, a turning-on signal Von is provided through a respective one of the plurality of sensing control signal lines SCL to the gate electrode of the sensing transistor Ts, to turn on the sensing transistor Ts, allowing the residual voltage signal V1 at the anode of the respective light emitting element LE to pass through the sensing transistor Ts and transmit to the integrated circuit through a respective sensing signal line SL. At the end of the sensing phase, a turning-off signal Voff is provided through a respective one of the plurality of sensing control signal lines SCL to the gate electrode of the sensing transistor Ts, to turn off the sensing transistor Ts. At the end of the sensing phase, the value of the residual voltage signal V1 is measured. Based on the types of the display apparatus and values of the initial voltage signal V0, various appropriate second periods of time may be used. In one example, the second period of time is in a range of dozens of micro seconds to thousands of micro seconds.

Various appropriate methods may be used to provide the initial voltage signal V0 to the anode of the respective light emitting element in the respective subpixel. In some embodiments, providing the initial voltage signal includes providing the initial voltage signal to a source electrode of a reset transistor in the respective pixel driving circuit, a drain electrode of the reset transistor being connected to the anode of the respective light emitting element, and providing a reset control signal to a gate electrode of the reset transistor to turn on the reset transistor for the first period of time. Referring to FIG. 2, FIG. 8, and FIG. 9, a turning-on reset control signal is provided through the reset control signal line of a next stage rst(N+1) to the gate electrode of the sixth transistor T6 to turn on the sixth transistor T6 for the first period of time. An initial voltage signal (e.g., transmitted from the reset signal line of a present stage VintN) is provided to a source electrode of the sixth transistor T6. The sixth transistor T6 is turned on for the first period of time, allowing the initial voltage signal to pass from the source electrode of the sixth transistor T6 to the drain electrode of the sixth transistor T6, and to the anode of the respective light emitting element LE.

As shown in FIG. 3A and FIG. 3D, the reset signal line is in the second conductive layer (e.g., in a same layer as the second capacitor electrode Ce2). Typically, the signal lines in the second conductive layer has a relatively larger resistance as compared to the first signal line layer (see, FIG. 3E). Due to the relatively larger loading in the reset signal line, the initial voltage signal V0 transmitted to subpixels in a central area of the display apparatus may be different from the initial voltage signal V0 transmitted to subpixels in an edge area of the display apparatus, resulting in initial voltage signals transmitted to different areas of the display apparatus being non-uniform.

In some embodiments, and referring to FIG. 2, providing the initial voltage signal includes providing the initial voltage signal to a drain electrode of a sensing transistor Ts in the sensing sub-circuit through a respective sensing signal line, a source electrode of the sensing transistor Ts being connected to the anode of the respective light emitting element LE; and providing a sensing control signal through a respective one of the plurality of sensing control signal lines SCL to a gate electrode of the sensing transistor Ts to turn on the sensing transistor Ts for the first period of time. As shown in FIG. 3E, the plurality of sensing signal lines SL is in the first signal line layer, which has a relatively smaller resistance as compared to the second conductive layer. Due to the relatively smaller loading in the plurality of sensing signal lines SL, the initial voltage signals transmitted to different areas of the display apparatus are more uniform.

Referring to FIG. 5 and FIG. 6, the display apparatus in some embodiments further includes a reference signal line Vref; a first reference control signal line Ref-sw1; and a plurality of first reference transistors Trf1, source electrodes of the plurality of first reference transistors Trf1 respectively connected to the reference signal line Vref, drain electrodes of the plurality of first reference transistors Trf1 respectively connected to the plurality of sensing signal lines SL, and gate electrodes of the plurality of first reference transistors Trf1 respectively connected to the first reference control signal line Ref-sw1.

Figure 10:
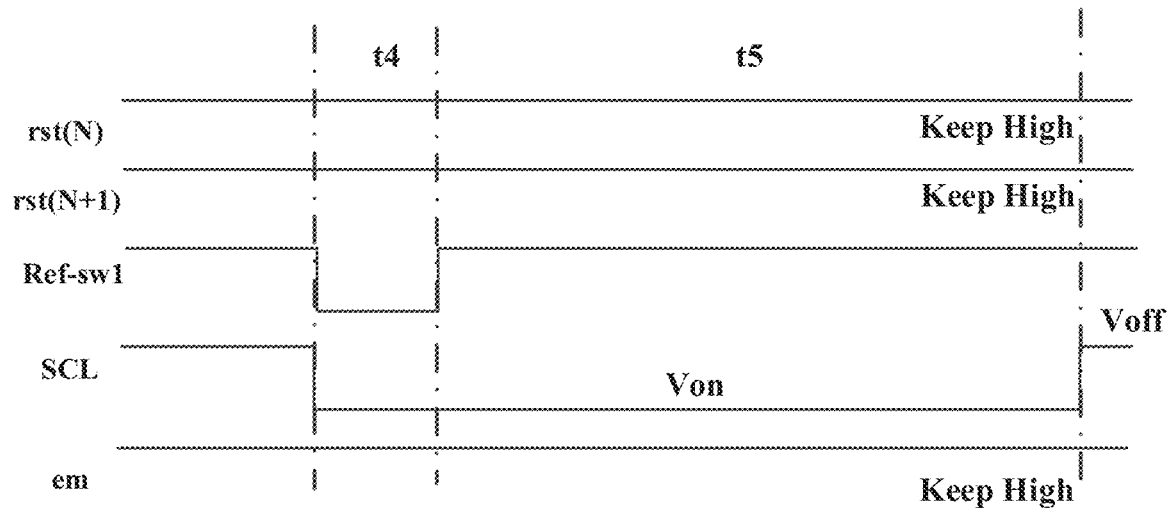
FIG. 10 is a timing diagram of operating a display apparatus in a sensing phase in some embodiments according to the present disclosure.

FIG. 10 is a timing diagram of operating a display apparatus in a sensing phase in some embodiments according to the present disclosure. Referring to FIG. 2, FIG. 5, FIG. 6, and FIG. 10, in the charging sub-phase t4, a turning-on control signal is provided through the first reference control signal line Ref-sw1 to the gate electrode of a respective one of the plurality of first reference transistors Trf1 to turn on the respective one of the plurality of first reference transistors Trf1 for the first period of time. An initial voltage signal (e.g., transmitted from the reference signal line Vref) is provided to a source electrode of the respective one of the plurality of first reference transistors Trf1. The respective one of the plurality of first reference transistors Trf1 is turned on for the first period of time, allowing the initial voltage signal to pass from the source electrode of the respective one of the plurality of first reference transistors Trf1 to the drain electrode of the respective one of the plurality of first reference transistors Trf1, to a respective one of the plurality of sensing signal lines SL. A turning-on signal Von is provided through a respective one of the plurality of sensing control signal lines SCL to the gate electrode of the sensing transistor Ts, to turn on the sensing transistor Ts, allowing the initial voltage signal to pass from the drain electrode of the sensing transistor Ts to the source electrode of the sensing transistor Ts, and in turn to the anode of the respective light emitting element LE.

In the discharging sub-phase t5, a turning-on signal Von is provided through a respective one of the plurality of sensing control signal lines SCL to the gate electrode of the sensing transistor Ts, to turn on the sensing transistor Ts, allowing the residual voltage signal V1 at the anode of the respective light emitting element LE to pass through the sensing transistor Ts and transmit to the integrated circuit through a respective sensing signal line SL. At the end of the sensing phase, a turning-off signal Voff is provided through a respective one of the plurality of sensing control signal lines SCL to the gate electrode of the sensing transistor Ts, to turn off the sensing transistor Ts. At the end of the sensing phase, the value of the residual voltage signal V1 is measured.

Figure 11:
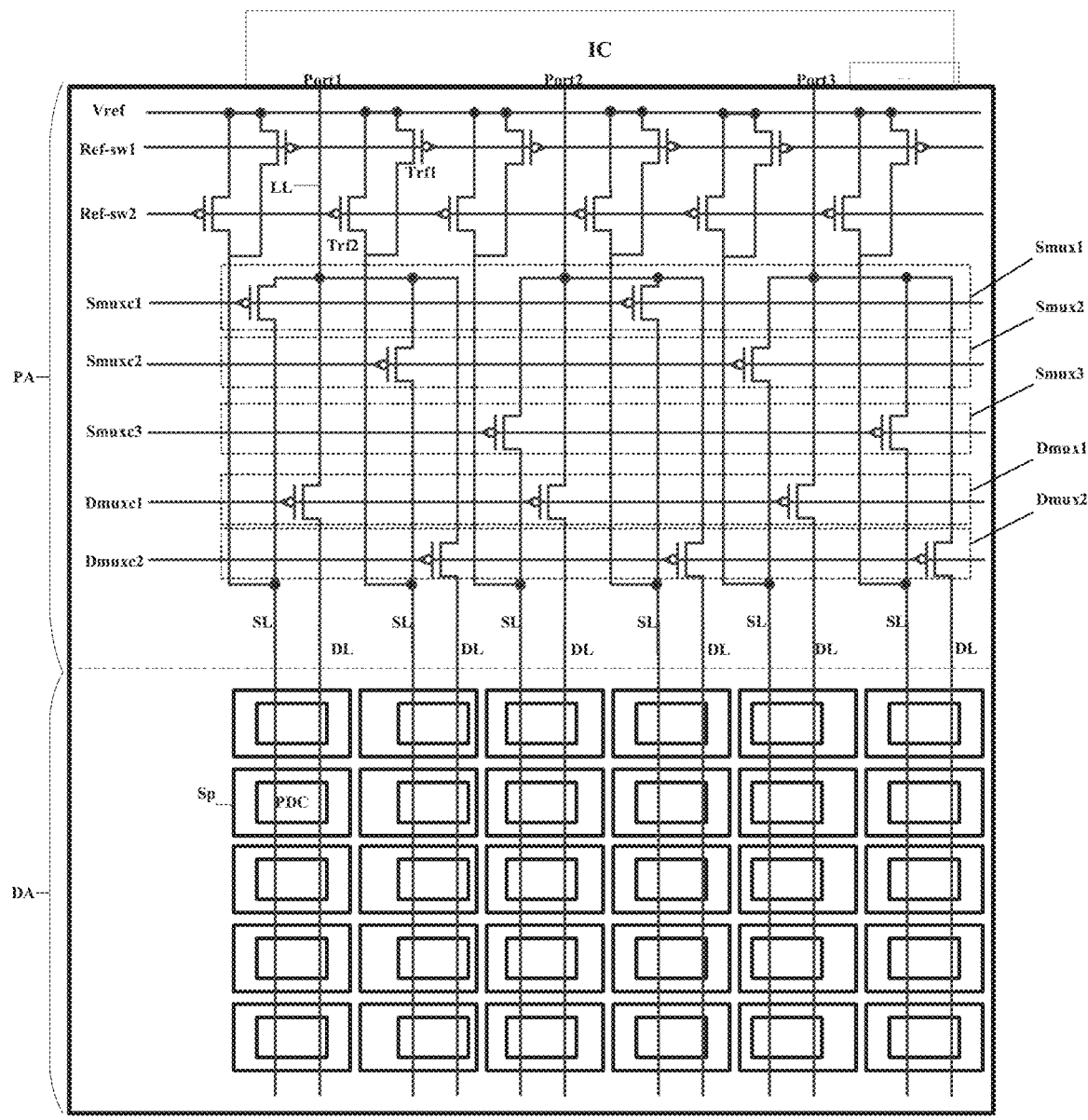
FIG. 11 is a schematic diagram illustrating the structure of a display apparatus in some embodiments according to the present disclosure.
Figure 12:
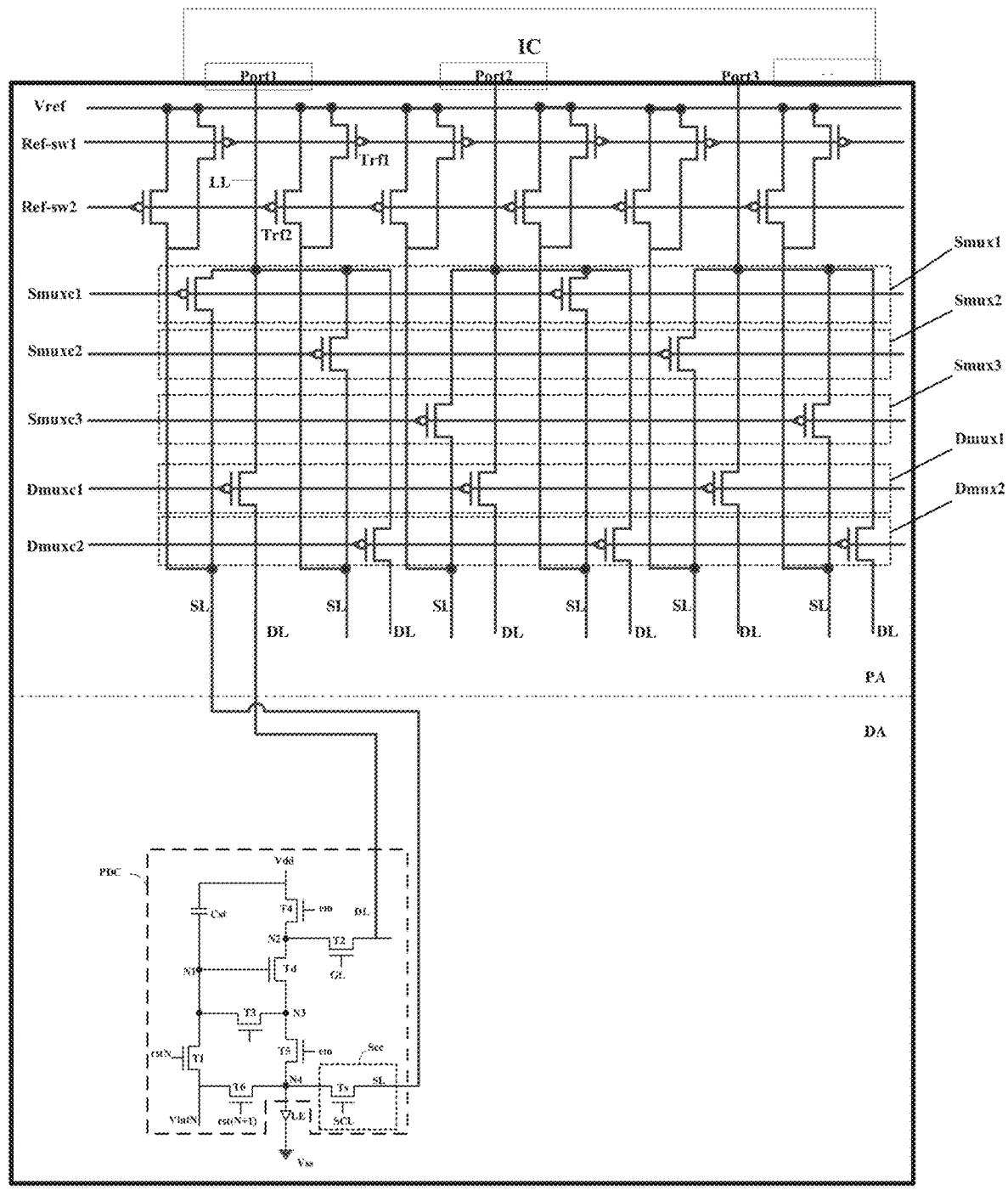
FIG. 12 is a schematic diagram illustrating electrical connection between an integrated circuit and a respective pixel driving circuit in a respective subpixel in a display apparatus in some embodiments according to the present disclosure.

FIG. 11 is a schematic diagram illustrating the structure of a display apparatus in some embodiments according to the present disclosure. FIG. 12 is a schematic diagram illustrating electrical connection between an integrated circuit and a respective pixel driving circuit in a respective subpixel in a display apparatus in some embodiments according to the present disclosure. Referring to FIG. 11 and FIG. 12, the display apparatus in some embodiments further includes a reference signal line Vref; a first reference control signal line Ref-sw1; a second reference control signal line Ref-sw2; a plurality of first reference transistors Trf1, source electrodes of the plurality of first reference transistors Trf1 respectively connected to the reference signal line Vref, drain electrodes of the plurality of first reference transistors Trf1 respectively connected to the plurality of sensing signal lines SL, and gate electrodes of the plurality of first reference transistors Trf1 respectively connected to the first reference control signal line Ref-sw1; and a plurality of second reference transistors Trf2, source electrodes of the plurality of second reference transistors Trf2 respectively connected to the reference signal line Vref, drain electrodes of the plurality of second reference transistors Trf2 respectively connected to the plurality of sensing signal lines SL, and gate electrodes of the plurality of second reference transistors Trf2 respectively connected to the second reference control signal line Ref-sw2.

In some embodiments, providing the initial voltage signal further includes providing the initial voltage signal to a source electrode of a first reference transistor and a source electrode of a second reference transistor through a reference signal line, a drain electrode of the first reference transistor and a drain electrode of the second reference transistor being connected to the source electrode of the sensing transistor through the respective sensing signal line;

and providing a reference control signal to a gate electrode of the first reference transistor or a gate electrode of the second reference transistor or both to turn on the first reference transistor or the second reference transistor or both, for the first period of time.

Figure 13:
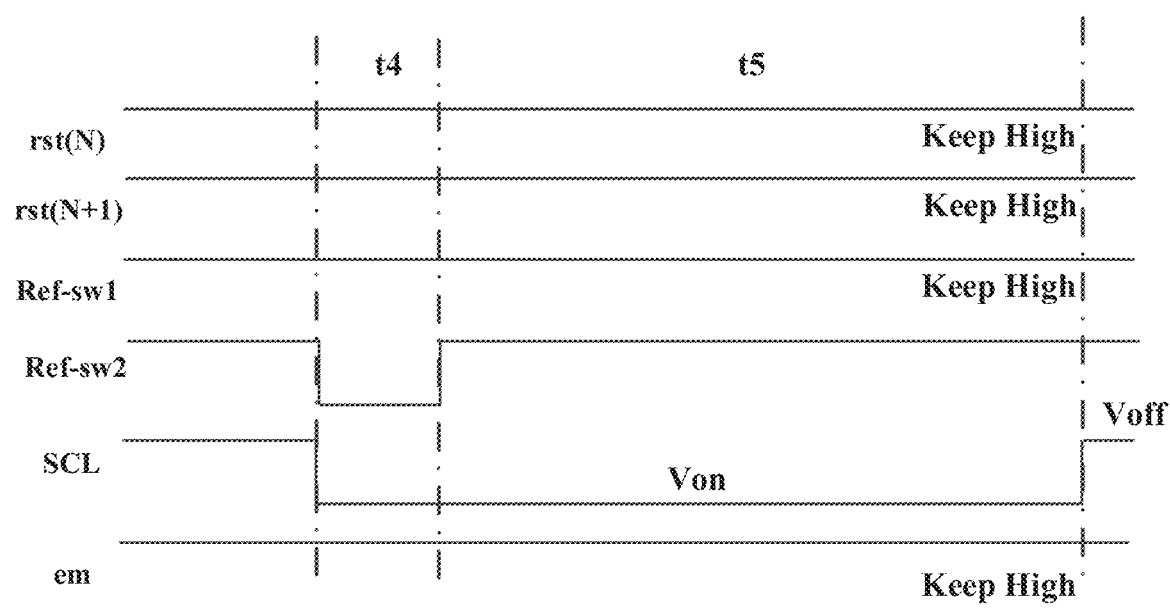
FIG. 13 is a timing diagram of operating a display apparatus in a sensing phase in some embodiments according to the present disclosure.

FIG. 13 is a timing diagram of operating a display apparatus in a sensing phase in some embodiments according to the present disclosure. Referring to FIG. 2, FIG. 11, FIG. 12, and FIG. 13, in the charging sub-phase t4, a turning-on control signal is provided through the second reference control signal line Ref-sw2 to the gate electrode of a respective one of the plurality of second reference transistors Trf2 to turn on the respective one of the plurality of second reference transistors Trf2 for the first period of time. An initial voltage signal (e.g., transmitted from the reference signal line Vref) is provided to a source electrode of the respective one of the plurality of second reference transistors Trf2. The respective one of the plurality of second reference transistors Trf2 is turned on for the first period of time, allowing the initial voltage signal to pass from the source electrode of the respective one of the plurality of second reference transistors Trf2 to the drain electrode of the respective one of the plurality of second reference transistors Trf2, to a respective one of the plurality of sensing signal lines SL. A turning-on signal Von is provided through a respective one of the plurality of sensing control signal lines SCL to the gate electrode of the sensing transistor Ts, to turn on the sensing transistor Ts, allowing the initial voltage signal to pass from the drain electrode of the sensing transistor Ts to the source electrode of the sensing transistor Ts, and in turn to the anode of the respective light emitting element LE.

In the discharging sub-phase t5, a turning-on signal Von is provided through a respective one of the plurality of sensing control signal lines SCL to the gate electrode of the sensing transistor Ts, to turn on the sensing transistor Ts, allowing the residual voltage signal V1 at the anode of the respective light emitting element LE to pass through the sensing transistor Ts and transmit to the integrated circuit through a respective sensing signal line SL. At the end of the sensing phase, a turning-off signal Voff is provided through a respective one of the plurality of sensing control signal lines SCL to the gate electrode of the sensing transistor Ts, to turn off the sensing transistor Ts. At the end of the sensing phase, the value of the residual voltage signal V1 is measured.

In some embodiments, the reference signal line Vref is in a same layer as a plurality of data lines. In one example, the reference signal line Vref is in the first signal line layer, which has a relatively smaller resistance as compared to the second conductive layer. Due to the relatively smaller loading in the reference signal line Vref, the initial voltage signals transmitted to different areas of the display apparatus are more uniform.

In some embodiments, the display apparatus further includes N number of sensing multiplexers, N≥2. The N number of sensing multiplexers are configured to be time-sequentially turned on to allow transmission of the residual voltage signals respectively from a plurality of columns of subpixels to the integrated circuit respectively through a plurality of sensing signal lines. Referring to FIG. 5, FIG. 6, FIG. 11, and FIG. 12, the N number of sensing multiplexers in some embodiments includes a first sensing multiplexer Smux1, a second sensing multiplexer Smux2, and a third sensing multiplexer Smux3. The first sensing multiplexer Smux1, the second sensing multiplexer Smux2, and the third sensing multiplexer Smux3 are configured to be time-sequentially turned on to allow transmission of the residual voltage signals respectively from a plurality of columns of subpixels to the integrated circuit IC respectively through a plurality of sensing signal lines SL.

In some embodiments, the method for image display further includes transmitting residual voltage signals respectively from a plurality of columns of subpixels to the integrated circuit IC through N number of sensing multiplexers, N≥2, the N number of sensing multiplexers configured to be time-sequentially turned on to allow transmission of the residual voltage signals respectively from the plurality of columns of subpixels to the integrated circuit IC respectively through a plurality of sensing signal lines SL.

Figure 14:
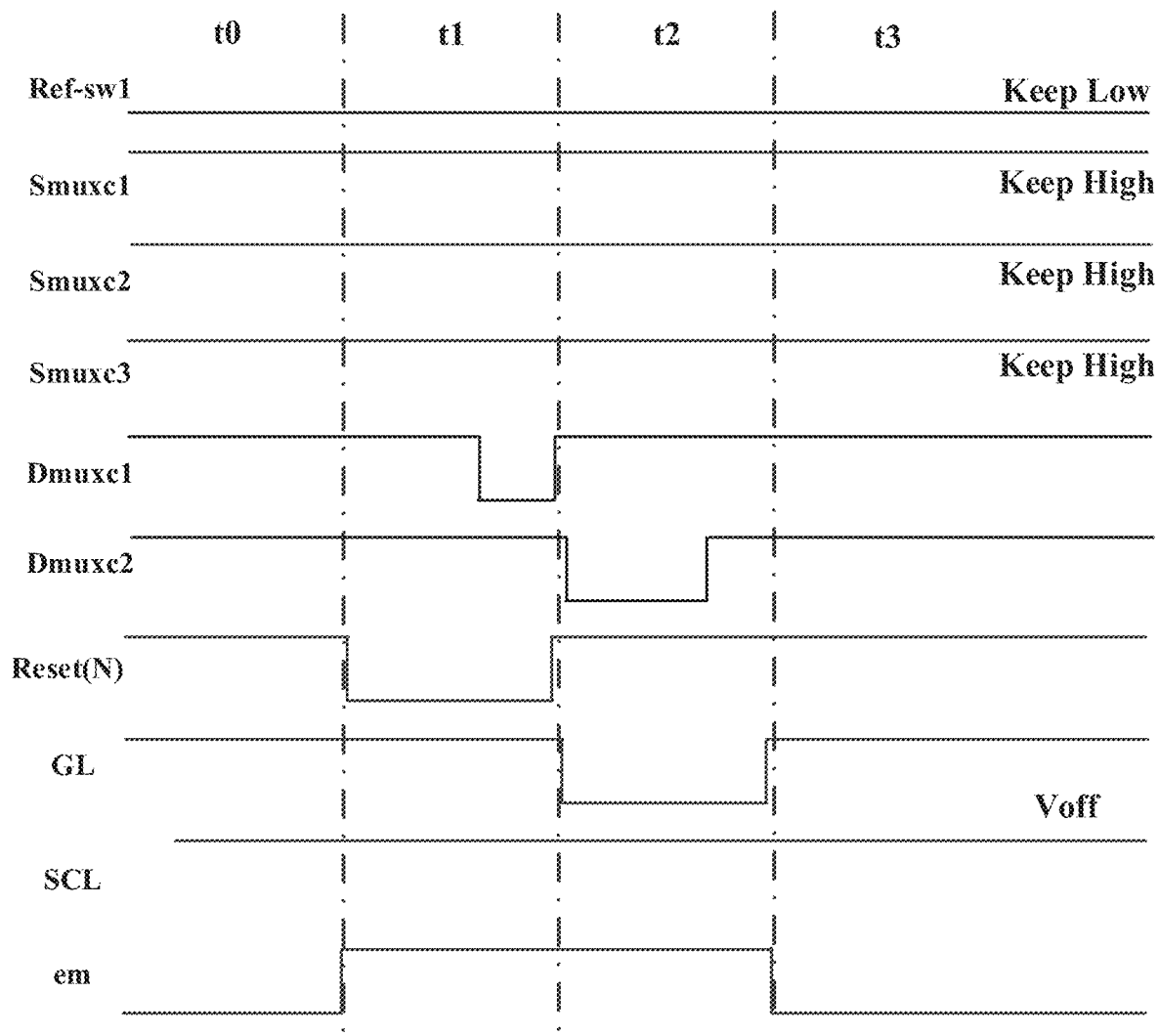
FIG. 14 is a timing diagram of operating a display apparatus in an image display phase in some embodiments according to the present disclosure.

FIG. 14 is a timing diagram of operating a display apparatus in an image display phase in some embodiments according to the present disclosure. FIG. 14 is a timing diagram of operating a display apparatus as depicted in FIG. 5 and FIG. 6. Referring to FIG. 5, FIG. 6, and FIG. 14, N number of sensing multiplexer control signal lines are provided with a high voltage signal (e.g., a turning-off signal) to turn off the N number of sensing multiplexers. A respective one of the N number of sensing multiplexer control signal lines is connected to gate electrodes of transistors in a respective one of the N number of sensing multiplexers. The turning-off signal provided to the respective one of the N number of sensing multiplexer control signal lines turns off the transistors in the respective one of the N number of sensing multiplexers. In one example, the N number of sensing multiplexers includes a first sensing multiplexer Smux1, a second sensing multiplexer Smux2, and a third sensing multiplexer Smux3; the N number of sensing multiplexer control signal lines includes a first sensing multiplexer control signal line Smuxc1, a second sensing multiplexer control signal line Smuxc2, and a third sensing multiplexer control signal line Smuxc3.

In the image display phase, referring to FIG. 5, FIG. 6, and FIG. 14, the sensing transistor Ts remains turned off. A turning-off signal Voff is provided through a respective one of the plurality of sensing control signal lines SCL to the gate electrode of the sensing transistor Ts at all time during the image display phase.

In the image display phase, referring to FIG. 5, FIG. 6, and FIG. 14, the reference signal line Vref is configured to provide a reference voltage signal (e.g., the initial voltage signal V0 discussed above) to the plurality of sensing signal lines SL, to prevent the plurality of sensing signal lines SL to stay in a floating state. Accordingly, in the image display phase, the first reference control signal line Ref-sw1 are provided with a low voltage signal (e.g., a turning-on signal) to turn on the plurality of first reference transistors Trf1. Because the plurality of first reference transistors Trf1 are turned on at all time, the threshold voltage of the plurality of first reference transistors Trf1 may have a negative shift due to the negative bias temperature stress (NBTS) effect, affecting the reference voltage signal transmitted to the plurality of sensing signal lines SL. To avoid this issue, the display apparatus may further include a plurality of second reference transistors Trf2 and a second reference control signal line Ref-sw2. The plurality of first reference transistors Trf1 and the plurality of second reference transistors Trf2 are operated in a time-division driving mode including a first mode and a second mode. In the first mode, the plurality of first reference transistors Trf1 are configured to be turned on and the plurality of second reference transistors Trf2 are configured to be turned off. In the second mode, the plurality of first reference transistors Trf1 are configured to be turned off and the plurality of second reference transistors Trf2 are configured to be turned on.

Figure 15:
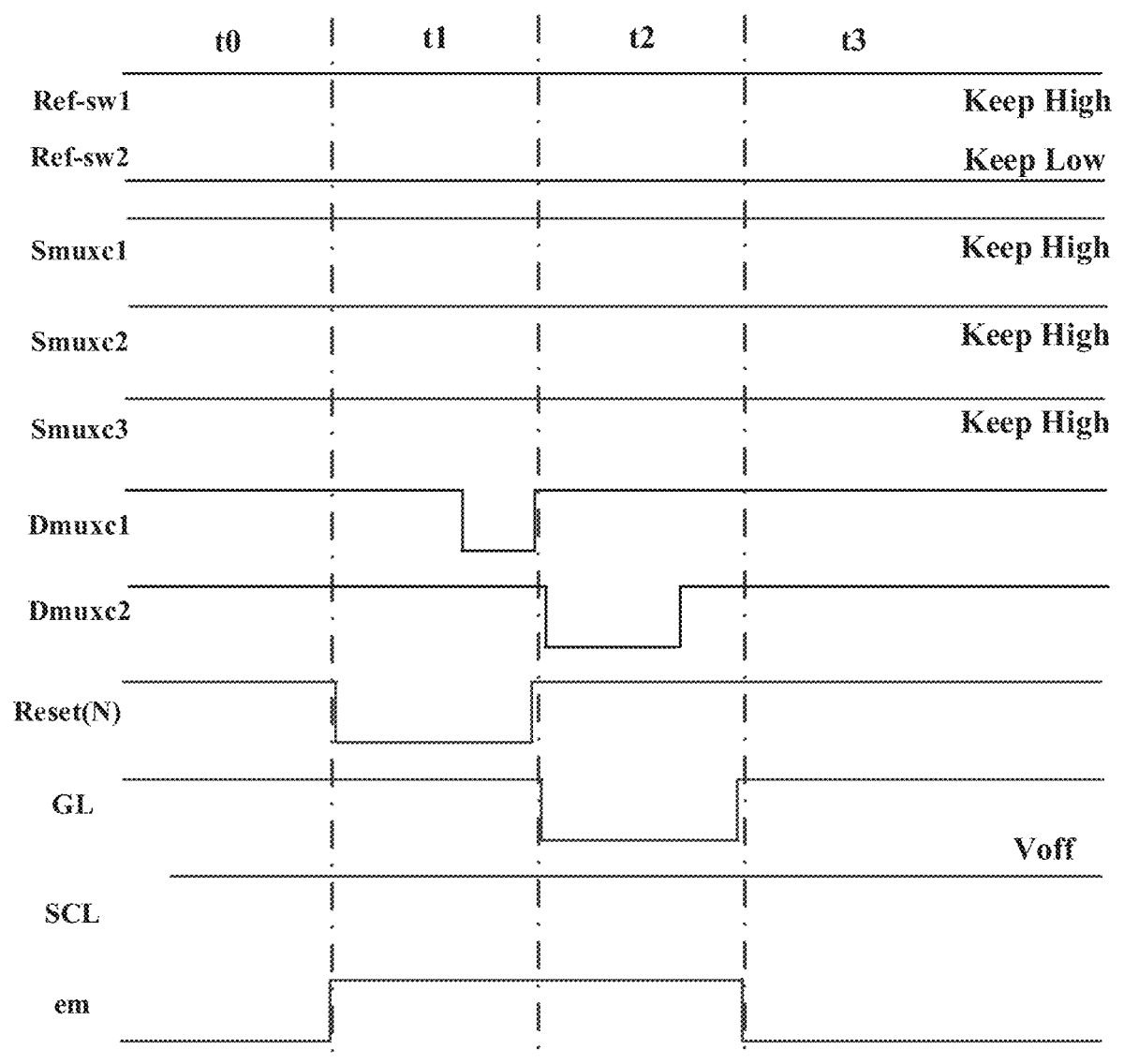

FIG. 15 is a timing diagram of operating a display apparatus in an image display phase in some embodiments according to the present disclosure. FIG. 15 is a timing diagram of operating a display apparatus as depicted in FIG. 11 and FIG. 12. Referring to FIG. 11, FIG. 12, and FIG. 15, the plurality of first reference transistors Trf1 and the plurality of second reference transistors Trf2 are operated in a time-division driving mode. FIG. 15 shows a second mode in which the plurality of first reference transistors Trf1 are configured to be turned off and the plurality of second reference transistors Trf2 are configured to be turned on.

In some embodiments, the integrated circuit is a data driving integrated circuit. The display apparatus further includes M number of data multiplexers, M≥2; and a plurality of data lines respectively connected to the plurality of columns of subpixels. The M number of data multiplexers are configured to be time-sequentially turned on to allow transmission of the data signals respectively to the plurality of columns of subpixels respectively through the plurality of data lines. Referring to FIG. 5, FIG. 6, FIG. 11, and FIG. 12, the M number of data multiplexers in some embodiments includes a first data multiplexer Dmux1 and a second data multiplexer Dmux2. The first data multiplexer Dmux1 and the second data multiplexer Dmux2 are configured to be time-sequentially turned on to allow transmission of the data signals respectively to the plurality of columns of subpixels respectively through the plurality of data lines SL.

Referring to FIG. 5, FIG. 6, FIG. 11, FIG. 12, in some embodiments, the display apparatus further includes a plurality of lead lines LL respectively connected to the integrated circuit IC. The plurality of lead lines LL are respectively connected to a plurality of bonding pins (e.g., port 1, port 2, port 3, . . . ) in the integrated circuit IC. A respective lead line of the plurality of lead lines LL is connected to source electrodes of at least two switching transistors respectively from at least two different sensing multiplexers of the N number of sensing multiplexers and connected to source electrodes of at least two switching transistors respectively from at least two different data multiplexers of the M number of data multiplexers.

In some embodiments, the method for image display further includes transmitting data signals from the integrated circuit respectively to the plurality of columns of subpixels through M number of data multiplexers, M≥2, the M number of data multiplexers configured to be time-sequentially turned on to allow transmission of the data signals respectively to the plurality of columns of subpixels respectively through a plurality of data lines.

Referring to FIG. 5, FIG. 6, FIG. 11, FIG. 12, FIG. 14, and FIG. 15, in the image display phase, M number of data multiplexer control signal lines are time-sequentially provided with a low voltage signal (e.g., a turning-on signal) to time-sequentially turn on the M number of data multiplexers. A respective one of the M number of data multiplexer control signal lines is connected to gate electrodes of transistors in a respective one of the M number of data multiplexers. The turning-on signal provided to the respective one of the M number of data multiplexer control signal lines turns on the transistors in the respective one of the M number of data multiplexers. In one example, the M number of data multiplexers includes a first data multiplexer Dmux1 and a second data multiplexer Dmux2; the M number of data multiplexer control signal lines includes a first data multiplexer control signal line Dmuxc1 and a second data multiplexer control signal line Dmuxc2.

Figure 16:
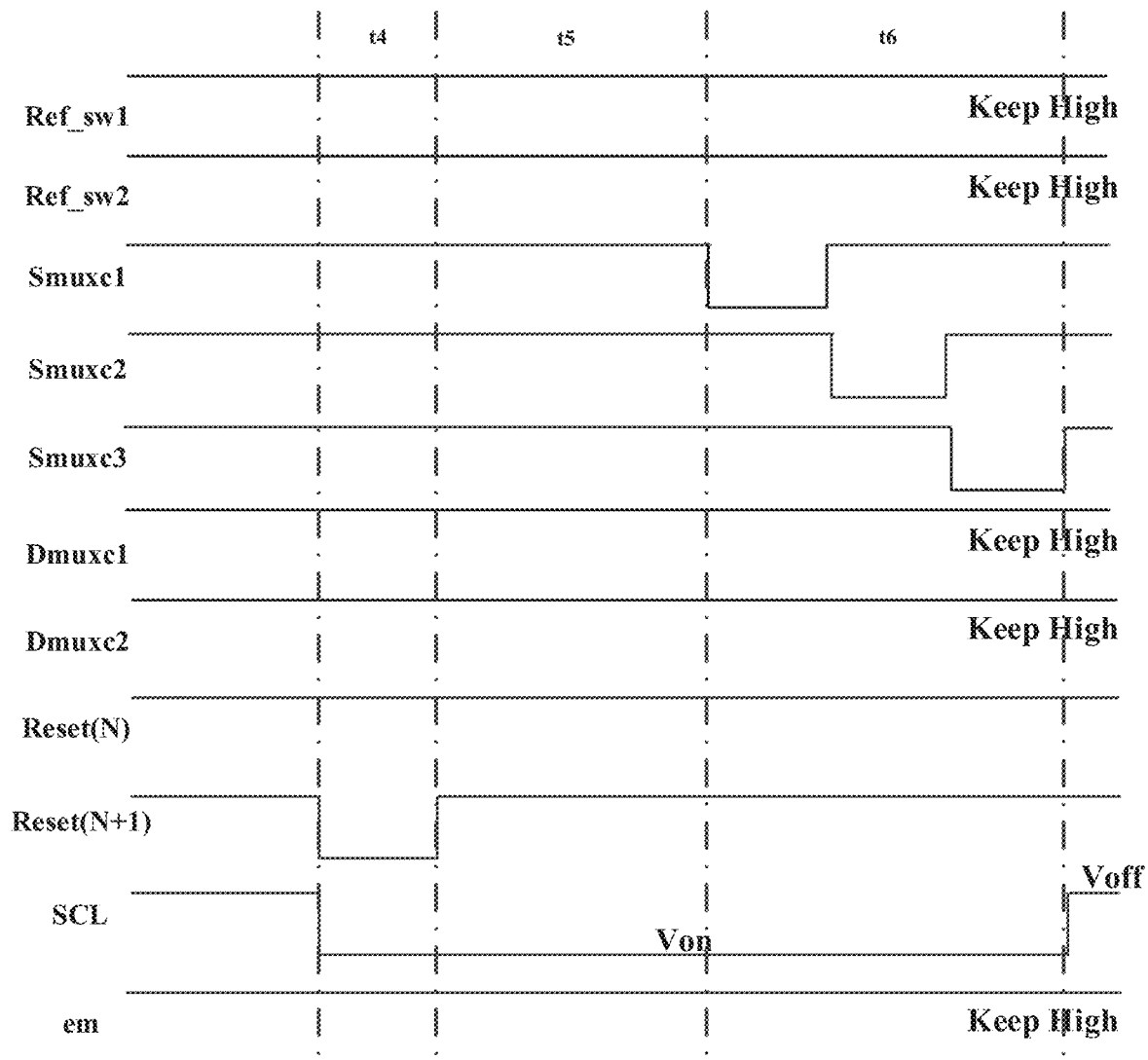
FIG. 16 is a timing diagram of operating a display apparatus in a sensing phase in some embodiments according to the present disclosure.
Figure 17:
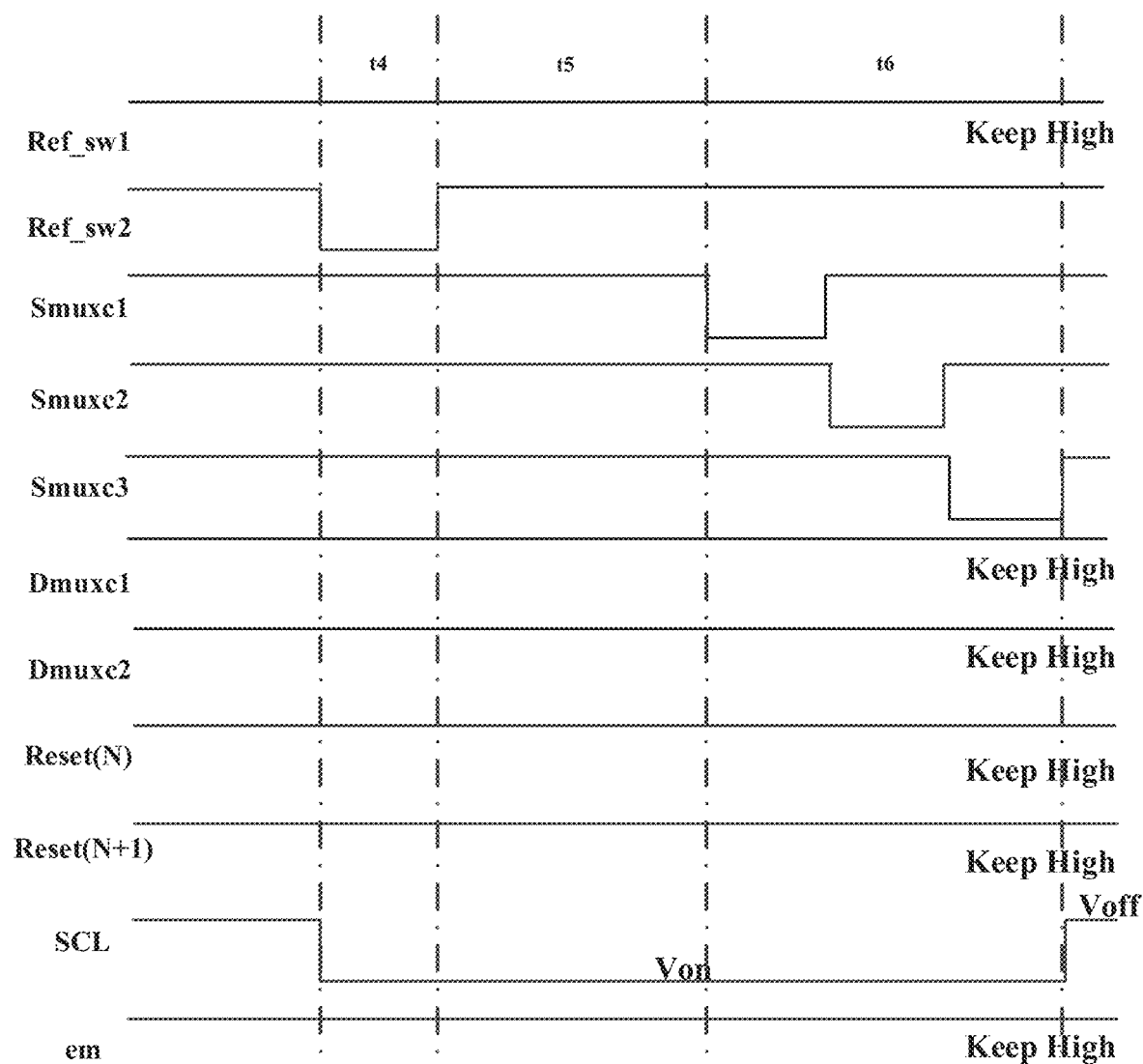
FIG. 17 is a timing diagram of operating a display apparatus in a sensing phase in some embodiments according to the present disclosure.

FIG. 16 is a timing diagram of operating a display apparatus in a sensing phase in some embodiments according to the present disclosure. FIG. 17 is a timing diagram of operating a display apparatus in a sensing phase in some embodiments according to the present disclosure. Referring to FIG. 16 and FIG. 17, in some embodiments, the sensing phase includes a charging sub-phase t4, a discharging sub-phase t5, and a detecting sub-phase t6.

FIG. 16 is a timing diagram of operating a display apparatus as depicted in FIG. 11 and FIG. 12. FIG. 16 illustrate an example in which the initial voltage signal is provided through the sixth transistor of the respective pixel driving circuit. Referring to FIG. 2, FIG. 11, FIG. 12, and FIG. 16, in the charging sub-phase t4, a turning-on reset control signal is provided through the reset control signal line of a next stage rst(N+1) to the gate electrode of the sixth transistor T6 to turn on the sixth transistor T6 for the first period of time. An initial voltage signal (e.g., transmitted from the reset signal line of a present stage VintN) is provided to a source electrode of the sixth transistor T6. The sixth transistor T6 is turned on for the first period of time, allowing the initial voltage signal to pass from the source electrode of the sixth transistor T6 to the drain electrode of the sixth transistor T6, and to the anode of the respective light emitting element LE.

FIG. 17 is a timing diagram of operating a display apparatus as depicted in FIG. 11 and FIG. 12. FIG. 17 illustrate an example in which the initial voltage signal is provided through the sensing transistor in the sensing sub-circuit through the respective sensing signal line. Referring to FIG. 2, FIG. 11, FIG. 12, and FIG. 17, in the charging sub-phase t4, a turning-on control signal is provided through the second reference control signal line Ref-sw2 to the gate electrode of a respective one of the plurality of second reference transistors Trf2 to turn on the respective one of the plurality of second reference transistors Trf2 for the first period of time. An initial voltage signal (e.g., transmitted from the reference signal line Vref) is provided to a source electrode of the respective one of the plurality of second reference transistors Trf2. The respective one of the plurality of second reference transistors Trf2 is turned on for the first period of time, allowing the initial voltage signal to pass from the source electrode of the respective one of the plurality of second reference transistors Trf2 to the drain electrode of the respective one of the plurality of second reference transistors Trf2, to a respective one of the plurality of sensing signal lines SL. A turning-on signal Von is provided through a respective one of the plurality of sensing control signal lines SCL to the gate electrode of the sensing transistor Ts, to turn on the sensing transistor Ts, allowing the initial voltage signal to pass from the drain electrode of the sensing transistor Ts to the source electrode of the sensing transistor Ts, and in turn to the anode of the respective light emitting element LE.

Referring to FIG. 5, FIG. 6, FIG. 11, FIG. 12, FIG. 16, and FIG. 17, in the detecting sub-phase t6, the N number of sensing multiplexer control signal lines (e.g., a first sensing multiplexer control signal line Smuxc1, a second sensing multiplexer control signal line Smuxc2, and a third sensing multiplexer control signal line Smuxc3) are time-sequentially provided with a turning-on voltage signal to time-sequentially turn on the N number of sensing multiplexers in some embodiments (e.g., a first sensing multiplexer Smux1, a second sensing multiplexer Smux2, and a third sensing multiplexer Smux3), to allow transmission of the residual voltage signals respectively from a plurality of columns of subpixels to the integrated circuit IC respectively through a plurality of sensing signal lines SL. In the detecting subphase t6, a turning-on signal Von is provided through a respective one of the plurality of sensing control signal lines SCL to the gate electrode of the sensing transistor Ts, to turn on the sensing transistor Ts, allowing the residual voltage signal to pass from the sensing transistor Ts in a respective subpixel to the integrated circuit.

Figure 18:
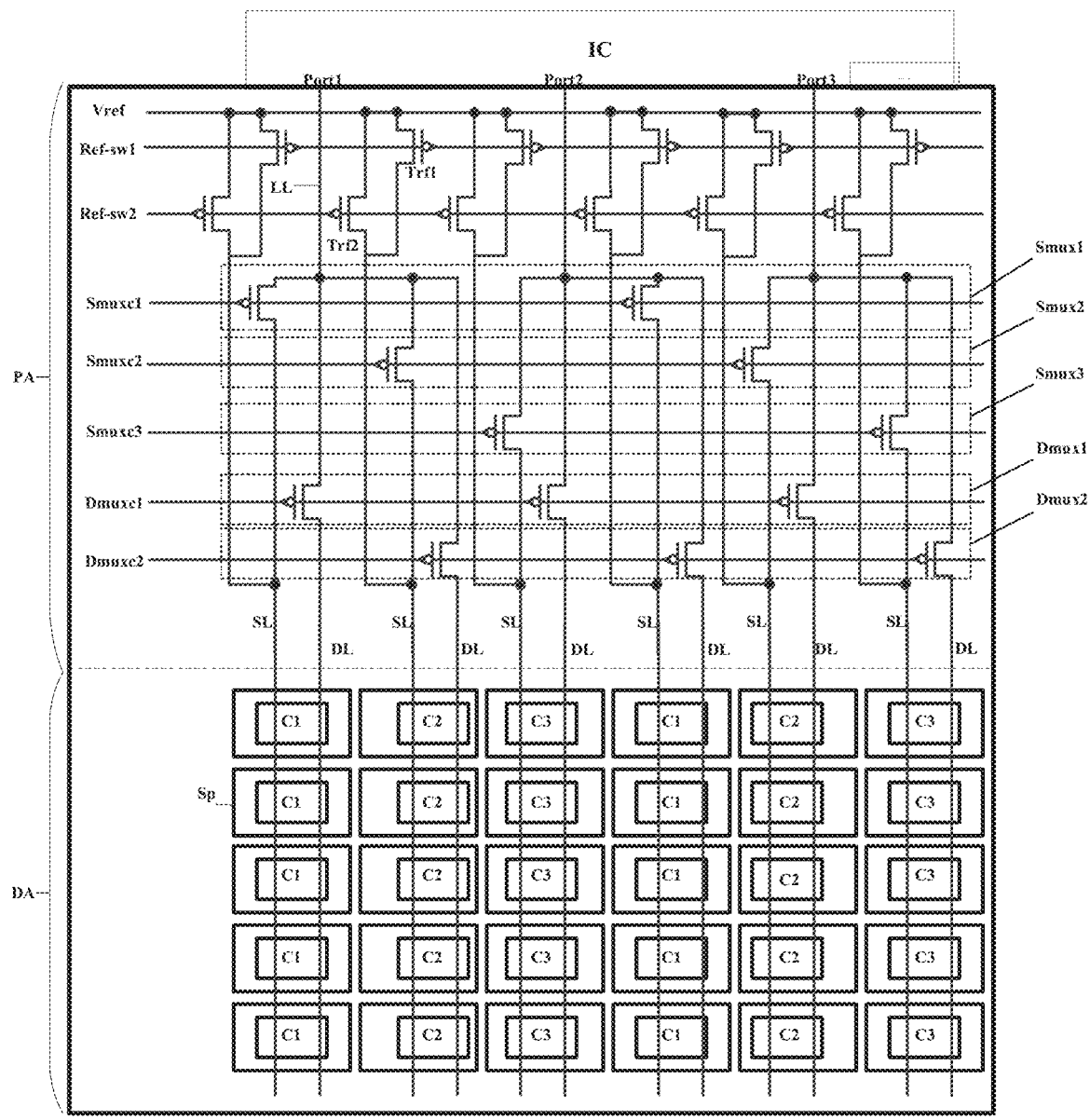
FIG. 18 is a schematic diagram illustrating the structure of a display apparatus in some embodiments according to the present disclosure.

FIG. 18 is a schematic diagram illustrating the structure of a display apparatus in some embodiments according to the present disclosure. Referring to FIG. 18, the N number of sensing multiplexers in some embodiments include a first sensing multiplexer Smux1, a second sensing multiplexer Smux2, and a third sensing multiplexer Smux3. The first sensing multiplexer Smux1 is configured to be turned on to allow transmission of first residual voltage signals respectively from first columns of subpixels of a first color C1 to the integrated circuit IC. The second sensing multiplexer Smux2 is configured to be turned on to allow transmission of second residual voltage signals respectively from second columns of subpixels of a second color C2 to the integrated circuit IC. The third sensing multiplexer Smux3 is configured to be turned on to allow transmission of third residual voltage signals respectively from third columns of subpixels of a third color C3 to the integrated circuit IC. Optionally, the first color C1, the second color C2, and the third color C3 are three different colors selected from red, green, and blue.

In some embodiments, the M number of data multiplexers comprise a first data multiplexer Dmux1 and a second data multiplexer Dmux2. The first data multiplexer Dmux1 is configured to be turned on to allow transmission of data signals respectively to odd-numbered columns of subpixels. The second data multiplexer Dmux2 is configured to be turned on to allow transmission of data signals respectively to even-numbered columns of subpixels.

In some embodiments, the display apparatus further includes a plurality of lead lines LL respectively connected to the integrated circuit IC. A respective lead line of the plurality of lead lines LL is connected to source electrodes of two switching transistors respectively from two different sensing multiplexers selected from the first sensing multiplexer Smux1, the second sensing multiplexer Smux2, and the third sensing multiplexer Smux3, and connected to source electrodes of two switching transistors respectively from the first data multiplexer Dmux1 and the second data multiplexer Dmux2.

In some embodiments, the display apparatus depicted in FIG. 18 has a real RGB pixel arrangement, in which the first columns of subpixels of a first color C1, the second columns of subpixels of a second color C2, and the third columns of subpixels of a third color C3 are alternately arranged along a row direction.

Figure 19:
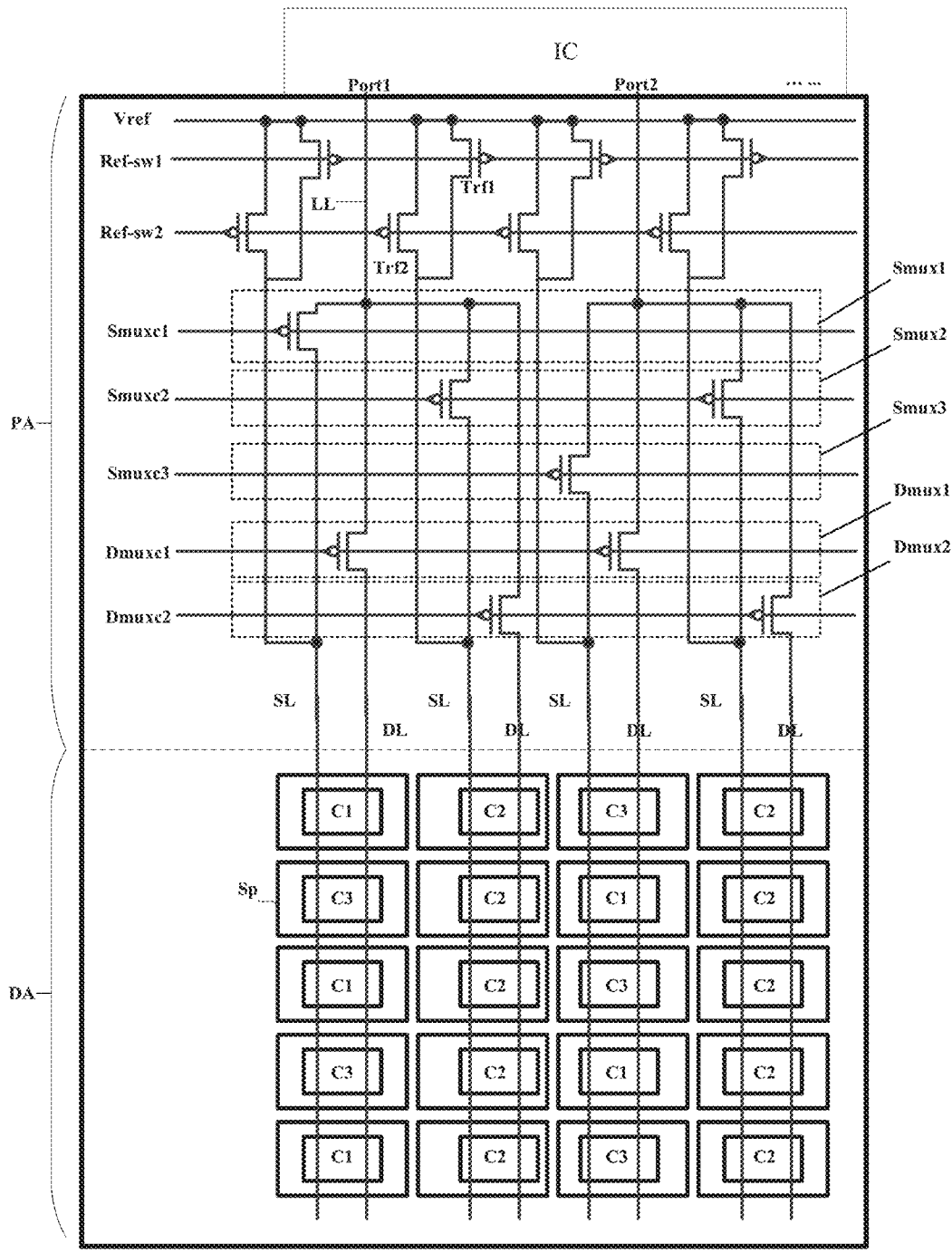
FIG. 19 is a schematic diagram illustrating the structure of a display apparatus in some embodiments according to the present disclosure.

FIG. 19 is a schematic diagram illustrating the structure of a display apparatus in some embodiments according to the present disclosure. Referring to FIG. 19, the N number of sensing multiplexers in some embodiments include a first sensing multiplexer Smux1, a second sensing multiplexer Smux2, and a third sensing multiplexer Smux3. The first sensing multiplexer Smux1 is configured to be turned on to allow transmission of first residual voltage signals respectively from first columns of subpixels to the integrated circuit IC. The second sensing multiplexer Smux2 is configured to be turned on to allow transmission of second residual voltage signals respectively from second columns of subpixels and fourth residual voltage signals respectively from fourth columns of subpixels to the integrated circuit IC. The third sensing multiplexer Smux3 is configured to be turned on to allow transmission of third residual voltage signals respectively from third columns of subpixels to the integrated circuit. A respective first column includes subpixels of a first color C1 and subpixels of a third color C3 alternately arranged along a column direction. A respective second column includes subpixels of a second color C2. A respective third column includes subpixels of the third color C3 and subpixels of the first color C1 alternately arranged along the column direction. A respective fourth column includes subpixels of the second color C2. Optionally, the first color C1, the second color C2, and the third color C3 are three different colors selected from red, green, and blue.

In some embodiments, the M number of data multiplexers comprise a first data multiplexer Dmux1 and a second data multiplexer Dmux2. The first data multiplexer Dmux1 is configured to be turned on to allow transmission of data signals respectively to odd-numbered columns of subpixels. The second data multiplexer Dmux2 is configured to be turned on to allow transmission of data signals respectively to even-numbered columns of subpixels.

In some embodiments, the display apparatus further includes a plurality of lead lines LL respectively connected to the integrated circuit IC. A respective lead line of the plurality of lead lines LL is connected to source electrodes of two switching transistors respectively from two different sensing multiplexers selected from the first sensing multiplexer Smux1, the second sensing multiplexer Smux2, and the third sensing multiplexer Smux3, and connected to source electrodes of two switching transistors respectively from the first data multiplexer Dmux1 and the second data multiplexer Dmux2.

In some embodiments, the display apparatus depicted in FIG. 19 has a pentile pixel arrangement, in which the first columns of subpixels, the second columns of subpixels, the third columns of subpixels, and the fourth columns of subpixels are alternately arranged along a row direction. The subpixels are arranged in an array. A respective first column includes a repeating pattern of C1-C3, in which C1 stands for a subpixel of the first color, and C3 stands for a subpixel of the third color. A respective third column includes a repeating pattern of C3-C1, in which C1 stands for a subpixel of the first color, and C3 stands for a subpixel of the third color. Optionally, the pentile pixel arrangement includes first rows of subpixels and second rows of subpixels alternately arranged along the column direction. A respective first row includes a repeating pattern of C1-C2-C3-C2, in which C1 stands for a subpixel of the first color, C2 stands for a subpixel of the second color, and C3 stands for a subpixel of the third color. A respective second row includes a repeating pattern of C3-C2-C1-C2, in which C1 stands for a subpixel of the first color, C2 stands for a subpixel of the second color, and C3 stands for a subpixel of the third color.

The first sensing multiplexer Smux1 is configured to be turned on to allow transmission of residual voltage signals respectively from subpixels of the first color C1 and subpixels of the third color C3 to the integrated circuit IC. The integrated circuit IC is configured to resort the residual voltage signals according to odd-numbered rows and even-numbered rows, thereby separating residual voltage signals from subpixels of the first color C1 and residual voltage signals from subpixels of the third color C3. Similarly, the third sensing multiplexer Smux3 is configured to be turned on to allow transmission of residual voltage signals respectively from subpixels of the third color C3 and subpixels of the first color C1 to the integrated circuit IC. The integrated circuit IC is configured to resort the residual voltage signals according to odd-numbered rows and even-numbered rows, thereby separating residual voltage signals from subpixels of the third color C3 and residual voltage signals from subpixels of the first color C1.

Figure 20:
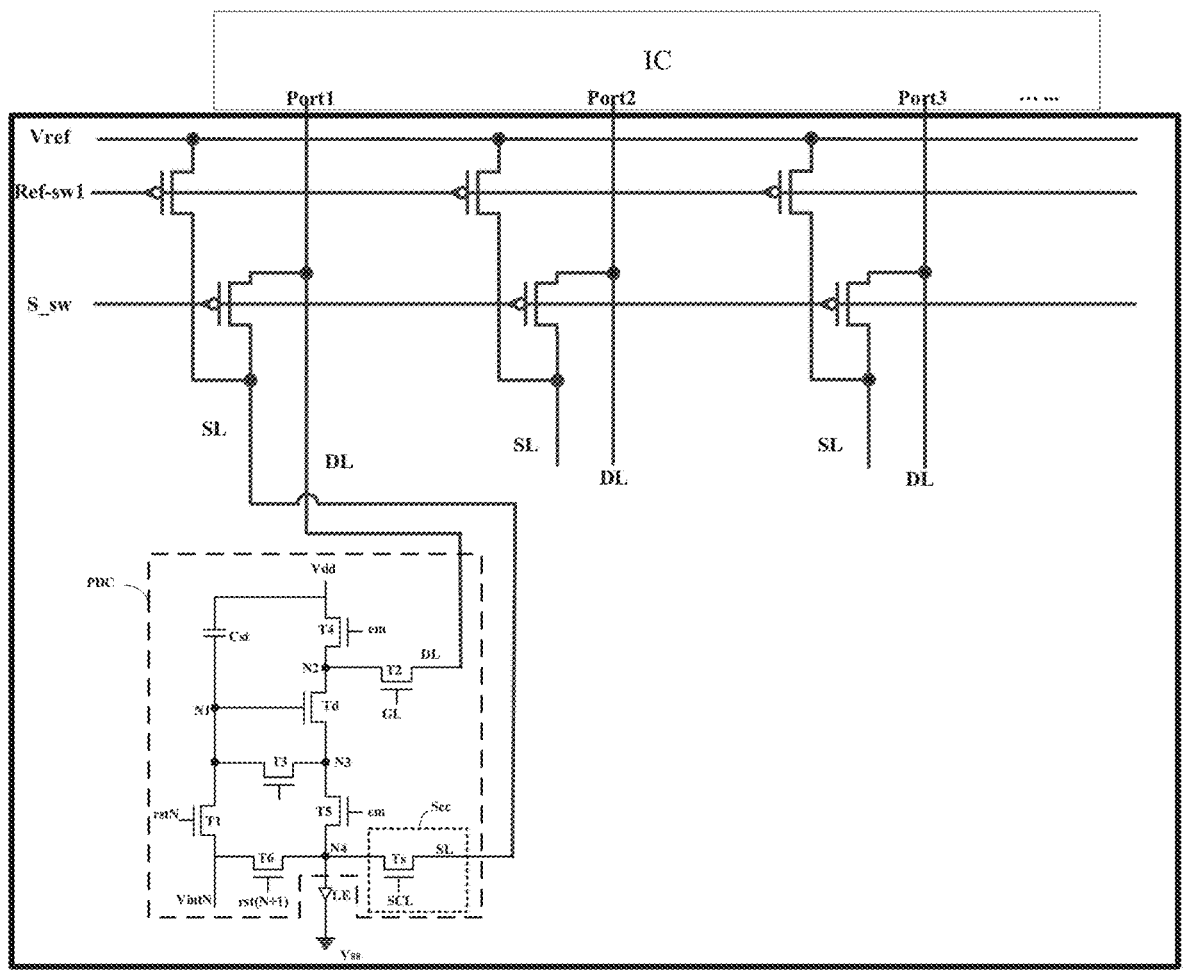
FIG. 20 is a schematic diagram illustrating electrical connection between an integrated circuit and a respective pixel driving circuit in a respective subpixel in a display apparatus in some embodiments according to the present disclosure.

FIG. 20 is a schematic diagram illustrating electrical connection between an integrated circuit and a respective pixel driving circuit in a respective subpixel in a display apparatus in some embodiments according to the present disclosure. FIG. 19 depicts a display apparatus in which multiplexer is not utilized.

Figure 21:
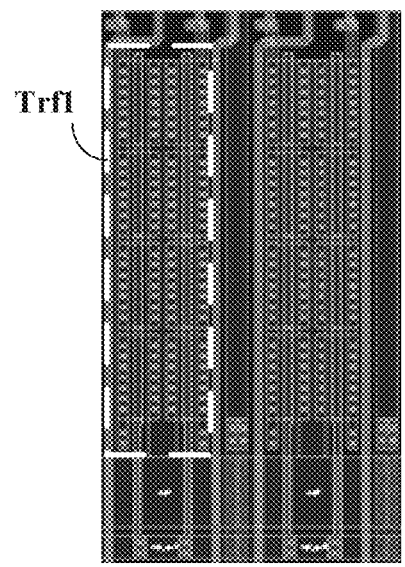
FIG. 21 is a scanning electron microscopy of a portion of a peripheral sensing circuit in some embodiments according to the present disclosure.
Figure 22:
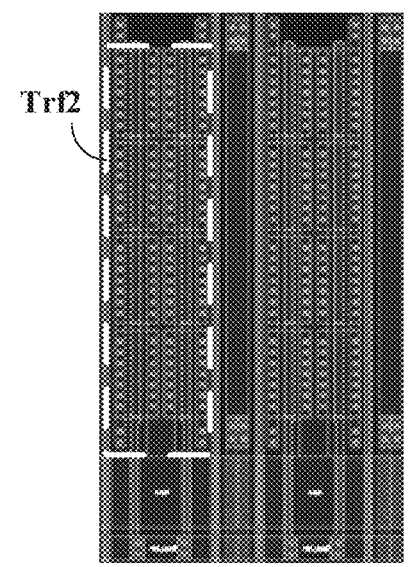
FIG. 22 is a scanning electron microscopy of a portion of a peripheral sensing circuit in some embodiments according to the present disclosure.

In another aspect, the present disclosure provides a peripheral sensing circuit. The peripheral sensing circuit is disposed in a peripheral area of a display apparatus. In some embodiments, the peripheral sensing circuit includes transistors respectively connected to a reference signal line, drain electrodes of the plurality of first reference transistors respectively connected to a plurality of sensing signal lines respectively connected to a plurality of columns of subpixels, and gate electrodes of the plurality of first reference transistors respectively connected to a first reference control signal line. FIG. 21 is a scanning electron microscopy of a portion of a peripheral sensing circuit in some embodiments according to the present disclosure. A respective one of a plurality of first reference transistors Trf1 is annotated in FIG. 21. Optionally, the peripheral sensing circuit further includes a plurality of second reference transistors, source electrodes of the plurality of second reference transistors respectively connected to the reference signal line, drain electrodes of the plurality of second reference transistors respectively connected to the plurality of sensing signal lines, and gate electrodes of the plurality of second reference transistors respectively connected to a second reference control signal line. FIG. 22 is a scanning electron microscopy of a portion of a peripheral sensing circuit in some embodiments according to the present disclosure. A respective one of a plurality of second reference transistors Trf2 is annotated in FIG. 22.

Figure 23:
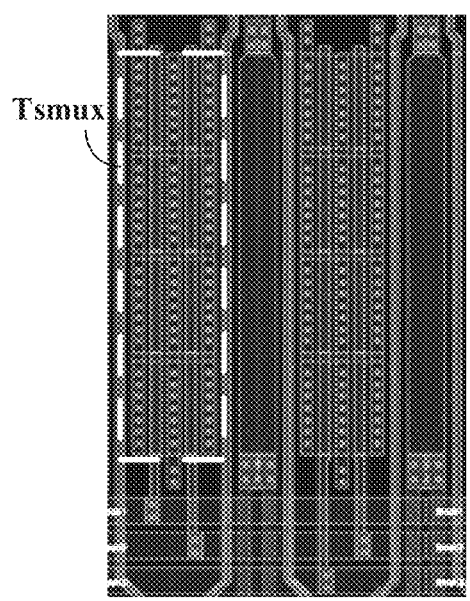
FIG. 23 is a scanning electron microscopy of a portion of a peripheral sensing circuit in some embodiments according to the present disclosure.

In some embodiments, the peripheral sensing circuit further includes N number of sensing multiplexers, N≥2. The N number of sensing multiplexers are configured to be time-sequentially turned on to allow transmission of the residual voltage signals respectively from a plurality of columns of subpixels to an integrated circuit respectively through the plurality of sensing signal lines. FIG. 23 is a scanning electron microscopy of a portion of a peripheral sensing circuit in some embodiments according to the present disclosure. A switching transistor Tsmux in a respective one of the N number of sensing multiplexers is annotated in FIG. 23.

Figure 24:
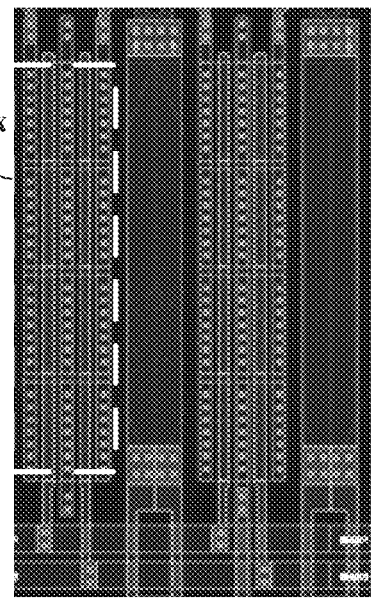
FIG. 24 is a scanning electron microscopy of a portion of a peripheral sensing circuit in some embodiments according to the present disclosure.

In some embodiments, the peripheral sensing circuit further includes M number of data multiplexers, M≥2. The M number of data multiplexers are configured to be time-sequentially turned on to allow transmission of data signals respectively to the plurality of columns of subpixels respectively through a plurality of data lines. FIG. 24 is a scanning electron microscopy of a portion of a peripheral sensing circuit in some embodiments according to the present disclosure. A switching transistor Tdmux in a respective one of the M number of data multiplexers is annotated in FIG. 24.

In another aspect, the present disclosure provides a pixel driving circuit. In some embodiments, the pixel driving circuit includes a storage capacitor; a driving transistor, and a sensing transistor having a gate electrode connected to a sensing control signal line, a source electrode connected to an anode of a respective light emitting element, and a drain electrode connected to a respective sensing signal line.

Optionally, the sensing transistor is configured to obtain a residual voltage signal at the anode of the respective light emitting element, after the anode is charged by an initial voltage signal for a first period of time, and allowed to discharge for a second period of time upon discontinuation of the initial voltage signal.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
   a plurality of pixel driving circuits;
   a plurality of sensing signal lines;
   an integrated circuit;
   N number of sensing multiplexers, N≥2;
   wherein a respective pixel driving circuit comprises a sensing sub-circuit configured to obtain a residual voltage signal at an anode of a respective light emitting element;
   a respective sensing signal line is configured to transmit the residual voltage signal to the integrated circuit;
   the integrated circuit is configured to compensate a data signal provided to a respective subpixel in a subsequent image display phase based on a residual voltage difference between a value of the residual voltage signal and a reference residual voltage value;
   the N number of sensing multiplexers are configured to be time-sequentially turned on to allow transmission of residual voltage signals respectively from a plurality of columns of subpixels to the integrated circuit respectively through a plurality of sensing signal lines;
   the N number of sensing multiplexers comprise a first sensing multiplexer, a second sensing multiplexer, and a third sensing multiplexer;

the first sensing multiplexer is configured to be turned on to allow transmission of first residual voltage signals respectively from first columns of subpixels to the integrated circuit;

the second sensing multiplexer is configured to be turned on to allow transmission of second residual voltage signals respectively from second columns of subpixels and fourth residual voltage signals respectively from fourth columns of subpixels to the integrated circuit;

the third sensing multiplexer is configured to be turned on to allow transmission of third residual voltage signals respectively from third columns of subpixels to the integrated circuit;

a respective first column comprises subpixels of a first color and subpixels of a third color alternately arranged along a column direction;

a respective second column comprises subpixels of a second color;

a respective third column comprises subpixels of the third color and subpixels of the first color alternately arranged along the column direction; and a respective fourth column comprises subpixels of the second color.

2. The display apparatus of claim 1, wherein the sensing sub-circuit comprises a sensing transistor having a gate electrode connected to a sensing control signal line, a source electrode connected to the anode of the respective light emitting element, and a drain electrode connected to the respective sensing signal line.

3. The display apparatus of claim 1, further comprising:
a reference signal line;
a first reference control signal line; and
a plurality of first reference transistors, source electrodes of the plurality of first reference transistors respectively connected to the reference signal line, drain electrodes of the plurality of first reference transistors respectively connected to the plurality of sensing signal lines, and gate electrodes of the plurality of first reference transistors respectively connected to the first reference control signal line.

4. The display apparatus of claim 3, wherein the reference signal line is in a same layer as a plurality of data lines.

5. The display apparatus of claim 1, further comprising:
a reference signal line;
a first reference control signal line;
a second reference control signal line;
a plurality of first reference transistors, source electrodes of the plurality of first reference transistors respectively connected to the reference signal line, drain electrodes of the plurality of first reference transistors respectively connected to the plurality of sensing signal lines, and gate electrodes of the plurality of first reference transistors respectively connected to the first reference control signal line; and
a plurality of second reference transistors, source electrodes of the plurality of second reference transistors respectively connected to the reference signal line, drain electrodes of the plurality of second reference transistors respectively connected to the plurality of sensing signal lines, and gate electrodes of the plurality of second reference transistors respectively connected to the second reference control signal line.

6. The display apparatus of claim 1, wherein the integrated circuit is a data driving integrated circuit;

the display apparatus further comprises:
M number of data multiplexers, M≥2; and
a plurality of data lines respectively connected to the plurality of columns of subpixels;
wherein the M number of data multiplexers are configured to be time-sequentially turned on to allow transmission of data signals respectively to the plurality of columns of subpixels respectively through the plurality of data lines.

7. The display apparatus of claim 6, further comprising a plurality of lead lines respectively connected to the integrated circuit;
wherein a respective lead line of the plurality of lead lines is connected to source electrodes of at least two switching transistors respectively from at least two different sensing multiplexers of the N number of sensing multiplexers and connected to source electrodes of at least two switching transistors respectively from at least two different data multiplexers of the M number of data multiplexers.

8. The display apparatus of claim 6, wherein the N number of sensing multiplexers comprise a first sensing multiplexer, a second sensing multiplexer, and a third sensing multiplexer;
the first sensing multiplexer is configured to be turned on to allow transmission of first residual voltage signals respectively from first columns of subpixels of a first color to the integrated circuit;
the second sensing multiplexer is configured to be turned on to allow transmission of second residual voltage signals respectively from second columns of subpixels of a second color to the integrated circuit;
the third sensing multiplexer is configured to be turned on to allow transmission of third residual voltage signals respectively from third columns of subpixels of a third color to the integrated circuit;
the M number of data multiplexers comprise a first data multiplexer and a second data multiplexer;
the first data multiplexer is configured to be turned on to allow transmission of data signals respectively to odd-numbered columns of subpixels; and
the second data multiplexer is configured to be turned on to allow transmission of data signals respectively to even-numbered columns of subpixels.

9. The display apparatus of claim 8, further comprising a plurality of lead lines respectively connected to the integrated circuit;
wherein a respective lead line of the plurality of lead lines is connected to source electrodes of two switching transistors respectively from two different sensing multiplexers selected from the first sensing multiplexer, the second sensing multiplexer, and the third sensing multiplexer, and connected to source electrodes of two switching transistors respectively from the first data multiplexer and the second data multiplexer.

10. The display apparatus of claim 6, wherein the N number of sensing multiplexers comprise a first sensing multiplexer, a second sensing multiplexer, and a third sensing multiplexer;
the first sensing multiplexer is configured to be turned on to allow transmission of first residual voltage signals respectively from first columns of subpixels to the integrated circuit;
the second sensing multiplexer is configured to be turned on to allow transmission of second residual voltage signals respectively from second columns of subpixels and fourth residual voltage signals respectively from fourth columns of subpixels to the integrated circuit;

the third sensing multiplexer is configured to be turned on to allow transmission of third residual voltage signals respectively from third columns of subpixels to the integrated circuit;

a respective first column comprises subpixels of a first color and subpixels of a third color alternately arranged along a column direction;

a respective second column comprises subpixels of a second color;

a respective third column comprises subpixels of the third color and subpixels of the first color alternately arranged along the column direction;

a respective fourth column comprises subpixels of the second color;

the M number of data multiplexers comprise a first data multiplexer and a second data multiplexer;

the first data multiplexer is configured to be turned on to allow transmission of data signals respectively to odd-numbered columns of subpixels; and the second data multiplexer is configured to be turned on to allow transmission of data signals respectively to even-numbered columns of subpixels.

11. The display apparatus of claim 10, further comprising a plurality of lead lines respectively connected to the integrated circuit;

wherein a respective lead line of the plurality of lead lines is connected to source electrodes of two switching transistors respectively from two different sensing multiplexers selected from the first sensing multiplexer, the second sensing multiplexer, and the third sensing multiplexer, and connected to source electrodes of two switching transistors respectively from the first data multiplexer and the second data multiplexer.

12. The display apparatus of claim 1, wherein the N number of sensing multiplexers comprise a first sensing multiplexer, a second sensing multiplexer, and a third sensing multiplexer;

the first sensing multiplexer is configured to be turned on to allow transmission of first residual voltage signals respectively from first columns of subpixels of a first color to the integrated circuit;

the second sensing multiplexer is configured to be turned on to allow transmission of second residual voltage signals respectively from second columns of subpixels of a second color to the integrated circuit; and the third sensing multiplexer is configured to be turned on to allow transmission of third residual voltage signals respectively from third columns of subpixels of a third color to the integrated circuit.

13. A method for image display in the display apparatus of claim 1, comprising:

displaying an image in a respective subpixel in an image display phase;

in a sensing phase subsequent to the image display phase, the method further comprises:

providing an initial voltage signal to an anode of a respective light emitting element in the respective subpixel for a first period of time;

allowing the anode of a respective light emitting element to discharge for a second period of time, upon discontinuation of the initial voltage signal;

obtaining a residual voltage signal at the anode of the respective light emitting element at an end of the second period of time by a sensing sub-circuit of a respective pixel driving circuit; and transmitting the residual voltage signal to an integrated circuit.

14. The method of claim 13, wherein, in a subsequent image display phase, the method further comprises compensating a data signal provided to the respective subpixel in the subsequent image display phase by the integrated circuit based on a residual voltage difference between a value of the residual voltage signal and a reference residual voltage value.

* * * * *